United States Patent
Boka

(10) Patent No.: US 10,883,830 B2
(45) Date of Patent: Jan. 5, 2021

(54) TERRESTRIAL LAND AIR AND SEA NAVIGATION SYSTEM

(71) Applicant: LOCKHEED MARTIN CORPORATION, Bethesda, MD (US)

(72) Inventor: Jeffrey B. Boka, Lumberton, NJ (US)

(73) Assignee: LOCKHEED MARTIN CORPORATION, Bethesda, MD (US)

(*) Notice: Subject to any disclaimer, the term of this patent is extended or adjusted under 35 U.S.C. 154(b) by 14 days.

(21) Appl. No.: 16/248,611

(22) Filed: Jan. 15, 2019

(65) Prior Publication Data

US 2020/0225041 A1 Jul. 16, 2020

(51) Int. Cl.
*G01C 21/16* (2006.01)
*G01R 33/032* (2006.01)
*G01C 17/28* (2006.01)

(52) U.S. Cl.
CPC .......... *G01C 21/165* (2013.01); *G01C 17/28* (2013.01); *G01R 33/032* (2013.01)

(58) Field of Classification Search
CPC ..... G01C 21/165; G01C 17/28; G01R 33/032
See application file for complete search history.

(56) References Cited

U.S. PATENT DOCUMENTS

| 6,459,990 | B1* | 10/2002 | McCall | G01C 21/165 701/21 |
| 9,541,610 | B2* | 1/2017 | Kaup | G01R 33/032 |
| 9,910,105 | B2* | 3/2018 | Boesch | G01R 33/032 |

* cited by examiner

*Primary Examiner* — Reena Aurora
(74) *Attorney, Agent, or Firm* — Foley & Lardner LLP

(57) ABSTRACT

A system can include an inertial measurement unit, a magnetometer configured to measure a magnetic field, and a processing system having an ORSE filter. The processing system can be configured to determine an estimated position based on a change in velocity or angular rate based on data received from the inertial measurement unit, determine a difference between the measured magnetic field from the magnetometer and the expected magnetic field measurement, and determine a state estimate using the ORSE filter by updating a time propagation of state and covariance with a measurement update of the state and covariance. The processing system can be configured to transform a change in velocity, a change in angulate rate, and the measured magnetic field to an Earth-centered inertial reference frame for the ORSE filter.

21 Claims, 16 Drawing Sheets

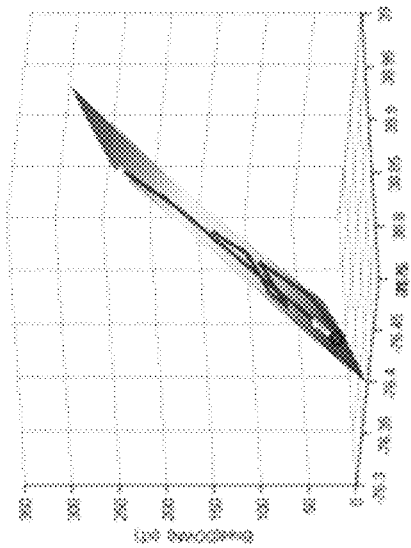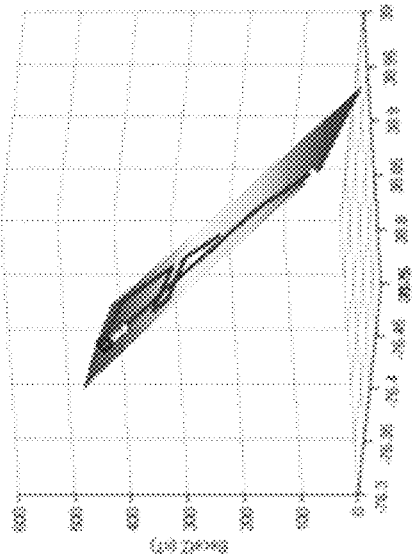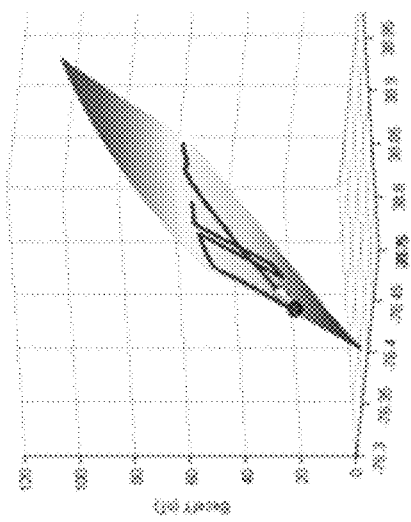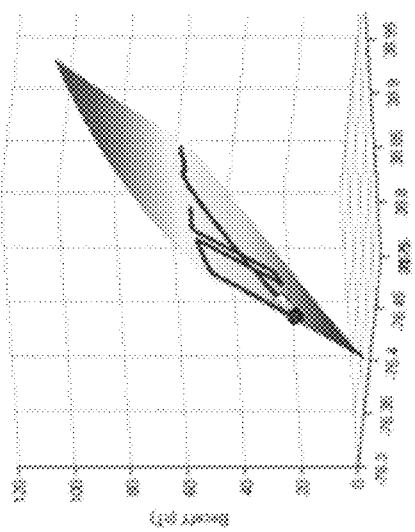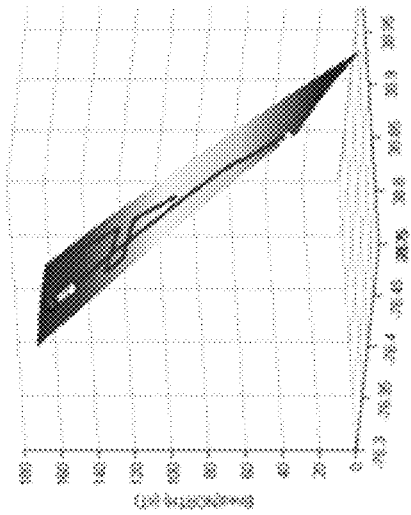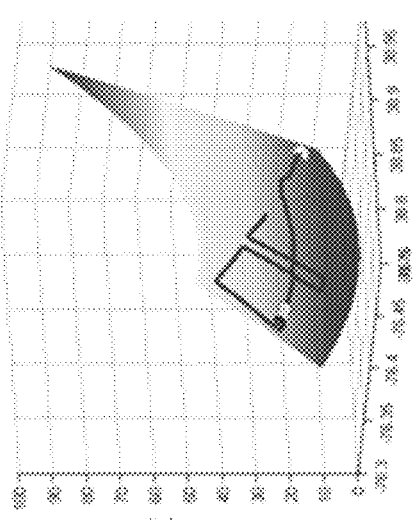
FIG. 11A
FIG. 11B

TERRESTRIAL LAND AIR AND SEA NAVIGATION SYSTEM

FIELD

The present disclosure generally relates to magnetometers and navigation using magneto-optical defect center materials, and more particularly (but not limited to), magnetometers including a nitrogen vacancy diamond material, for the purpose of providing precise terrestrial navigation when GPS is not available.

BACKGROUND

The following description is provided to assist the understanding of the reader. None of the information provided or references cited is admitted to be prior art. Some magnetometers use magneto-optical defect center materials to determine a magnetic field. Such magnetometers can direct light into the magneto-optical defect center material. Magneto-optical defect center materials with defect centers can be used to sense an applied magnetic field by transmitting light into the materials and measuring the responsive light that is emitted.

A number of industrial and scientific areas such as physics and chemistry can benefit from magnetic detection and imaging with a device that has improved sensitivity and/or the ability to capture signals that fluctuate rapidly (i.e., improved bandwidth) with a package that is small in size, efficient in power and reduced in volume. Navigation systems utilizing magneto-optical defect center materials are particularly challenging due to the error rates of such systems and the unavailability of accurate earth magnetic field reference data. Many advanced magnetic imaging systems can operate in restricted conditions, for example, high vacuum and/or cryogenic temperatures, which can make them inapplicable for imaging applications that require ambient or other conditions such as placement on vehicles. Furthermore, small size, weight and power (SWAP) magnetic sensors of moderate sensitivity, vector accuracy, and bandwidth are valuable in many applications. Consequently, there is a significant need for better magnetometers and GPS-less navigation utilizing magneto-optical defect center materials.

SUMMARY

Methods and systems are described for, among other things, a navigation system utilizing a magnetometer, and, more specifically, a magneto-optical defect center magnetometer.

According to some implementations, a system can include an inertial measurement unit, a magnetometer configured to measure a magnetic field, and a processing system having an optimal variance filter. The processing system can be configured to determine an estimated position based on a change in velocity or angular rate based on data received from the inertial measurement unit, determine a difference between the measured magnetic field from the magnetometer and the expected magnetic field measurement, and determine a state estimate using the ORSE filter by updating a time propagation of state and covariance with a measurement update of the state and covariance. The processing system can be configured to transform a change in velocity, a change in angulate rate, and the measured magnetic field to an Earth-centered inertial reference frame for the ORSE filter.

According to some implementations, a process can include setting an initial state position and angular position for a vehicle, receiving a measured change in velocity and a measured change in angular rate based on data from an inertial measurement unit, receiving a measured magnetic field from a magnetometer, determining an estimated position based on the change in velocity and/or angular rate, determining an expected magnetic field measurement based on the estimated position, determining a difference between the measured magnetic field from the magnetometer and the expected magnetic field measurement, and determine a state estimate of the vehicle utilizing an ORSE filter to update a time propagation of state and covariance with a measurement update of the state and covariance. The measured change in velocity, the measured change in angulate rate, and the measured magnetic field can be transformed to an Earth-centered inertial reference frame for the ORSE filter.

According to some implementations, a vehicle navigation system can include an inertial measurement unit, a magneto-optical defect center magnetometer, and a processing system having an ORSE filter. The inertial measurement unit can include one or more gyros and one or more accelerometers and can be configured to determine one of an absolute velocity and an absolute angular rate or a change in velocity and a change in angular rate. The magneto-optical defect center magnetometer can be configured to measure a magnetic field. The processing system can be configured to determine an estimated position based on data received from the inertial measurement unit, determine an expected magnetic field measurement based on the estimated position, determine a difference between the measured magnetic field from the magnetometer and the expected magnetic field measurement, and determine a state estimate using the ORSE filter by updating a time propagation of state and covariance with a measurement update of the state and covariance. The processing system can be configured to transform the measured magnetic field to an Earth-centered inertial reference frame for the ORSE filter.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The details of one or more implementations are set forth in the accompanying drawings and the description below. Other features, aspects, and advantages will become apparent from the description, the drawings, and the claims, in which:

FIGS. 11A and 11B are illustrative measured magnetic field measurements relative to known longitudinal and latitudinal positions of a vehicle separated into x, y, and z components for an Earth-Centered-Inertial reference frame;

Figure 1:
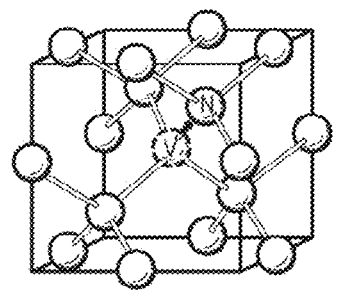
FIG. 1 illustrates one orientation of an Nitrogen-Vacancy (NV) center in a diamond lattice.

It will be recognized that some or all of the figures are schematic representations for purposes of illustration. The figures are provided for the purpose of illustrating embodiments with the explicit understanding that they will not be used to limit the scope or the meaning of the claims.

DETAILED DESCRIPTION

Atomic-sized magneto-optical defect centers, such as nitrogen-vacancy (NV) centers in diamond lattices, can have excellent sensitivity for magnetic field measurement and enable fabrication of small magnetic sensors. Magneto-optical defect center materials include but are not be limited to diamonds, Silicon Carbide (SiC), Phosphorous, and other materials with nitrogen, boron, carbon, silicon, or other defect centers. Diamond nitrogen vacancy (DNV) sensors may be maintained in room temperature and atmospheric pressure and can be even used in liquid environments. A green optical source (e.g., a micro-LED) can optically excite NV centers of the DNV sensor and cause emission of fluorescence radiation (e.g., red light) under off-resonant optical excitation. A magnetic field generated, for example, by a microwave coil can probe triplet spin states (e.g., with $m_s=-1, 0, +1$) of the NV centers to split based upon an external magnetic field projected along the NV axis, resulting in two spin resonance frequencies. The distance between the two spin resonance frequencies is a measure of the strength of the external magnetic field. A photo detector can measure the fluorescence (red light) emitted by the optically excited NV centers.

Magneto-optical defect center materials are those that can modify an optical wavelength of light directed at the defect center based on a magnetic field in which the magneto-defect center material is exposed. In some implementations, the magneto-optical defect center material may utilize nitrogen vacancy centers. Nitrogen-vacancy (NV) centers are defects in a diamond's crystal structure. Synthetic diamonds can be created that have these NV centers. NV centers generate red light when excited by a light source, such as a green light source, and microwave radiation. When an excited NV center diamond is exposed to an external magnetic field, the frequency of the microwave radiation at which the diamond generates red light and the intensity of the generated red light change. By measuring this change and comparing the change to the microwave frequency that the diamond generates red light at when not in the presence of the external magnetic field, the external magnetic field strength can be determined. Accordingly, NV centers can be used as part of a magnetic field sensor.

In some implementations, microwave RF excitation is used in a DNV sensor. The more uniform the microwave signal is across the NV centers in the diamond, the better and more accurate a NV sensor can perform. Uniformity, however, can be difficult to achieve. Also, the larger the bandwidth of the element, the better the NV sensor can perform. Large bandwidth, such as octave bandwidth, however, can be difficult to achieve. Various NV sensors respond to a microwave frequency that is not easily generated by RF antenna elements that are comparable to the small size of the NV sensor. In addition, RF elements reduce the amount of light within the sensor that is blocked by the RF elements. When a single RF element is used, the RF element is offset from the NV diamond when the RF element maximizes the faces and edges of the diamond that light can enter or leave. Moving the RF element away from the NV diamond, however, impacts the uniformity of strength of the RF that is applied to the NV diamond.

Some of the embodiments realize that the DNV magnetic sensors with dual RF elements provide a number of advantages. As described in greater detail below, using a two RF element arrangement in a DNV sensor can allow greater access to the edges and faces of the diamond for light input and egress, while still exciting the NV centers with a uniform RF field. In some implementations, each of the two microwave RF elements is contained on a circuit board. The RF elements can include multiple stacked spiral antenna coils. These stacked coils can occupy a small footprint and can provide the microwave RF field such that the RF field is uniform over the NV diamond.

In addition, all edges and faces of the diamond can be used for light input and egress. The more light captured by photo-sensing elements of a DNV sensor can result in an increased efficiency of the sensor. Various implementations use the dual RF elements to increase the amount of light collected by the DNV sensor. The dual RF elements can be fed by a single RF feed or by two separate RF feeds. If there are two RF feeds, the feeds can be individually controlled creating a mini-phased array antenna effect, which can enhance the operation of the DNV sensor.

The NV center in a diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. The neutral charge state uses the nomenclature $NV^0$, while the negative charge state uses the nomenclature NV, which is adopted in this description.

The NV center has a number of electrons, including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
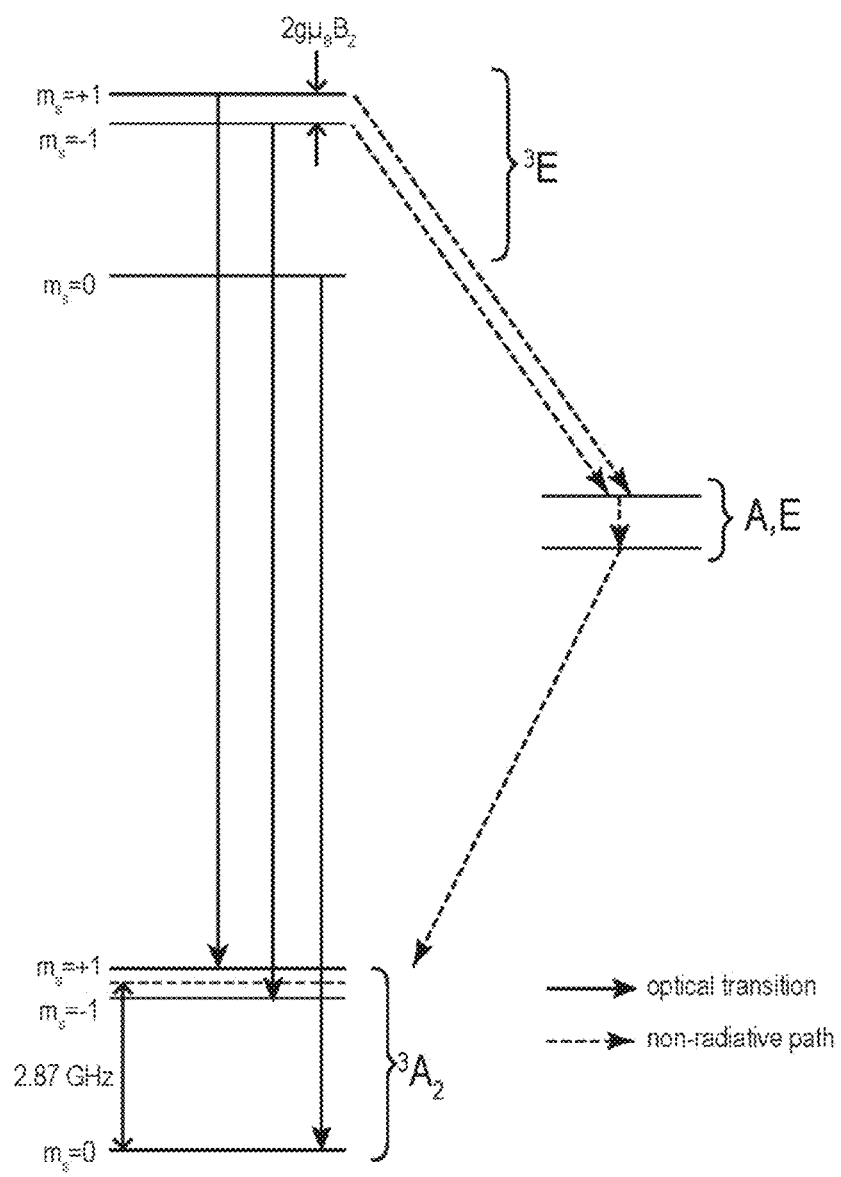
FIG. 2 illustrates an energy level diagram showing energy levels of spin states for a NV center.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm1$ energy levels are offset from the $m_s=0$ due to spin-spin interactions, and the $m_s=\pm1$ energy levels are degenerate, i.e., they have the same energy. The $m_s=0$ spin state energy level is split from the $m_s=\pm1$ energy levels by an energy of approximately 2.87 GHz for a zero external magnetic field.

Introducing an external magnetic field with a component along the NV axis lifts the degeneracy of the $m_s=\pm1$ energy levels, splitting the energy levels $m_s=\pm1$ by an amount $2g\mu_B B_z$, where g is the g-factor, $\mu_B$ is the Bohr magneton, and $B_z$ is the component of the external magnetic field along the NV axis. This relationship is correct to a first order and inclusion of higher order corrections is a straightforward matter and will not affect the computational and logic steps in the systems and methods described below.

The NV center electronic structure further includes an excited triplet state $^3E$ with corresponding $m_s=0$ and $m_s=\pm1$ spin states. The optical transitions between the ground state $^3A_2$ and the excited triplet $^3E$ are predominantly spin conserving, meaning that the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

There is, however, an alternative non-radiative decay route from the triplet $^3E$ to the ground state $^3A_2$ via intermediate electron states, which are thought to be intermediate singlet states A, E with intermediate energy levels. Significantly, the transition rate from the $m_s=\pm1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm1$ spins states. These features of the decay from the excited triplet $^3E$ state via the intermediate singlet states A, E to the ground state triplet $^3A_2$ allows that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm1$ states than for the $m_s=0$ spin state. This is so because the decay via the intermediate states does not result in a photon emitted in the fluorescence band, and because of the greater probability that the $m_s=\pm1$ states of the excited triplet $^3E$ state will decay via the non-radiative decay path. The lower fluorescence intensity for the $m_s=\pm1$ states than for the $m_s=0$ spin state allows the fluorescence intensity to be used to determine the spin state. As the population of the $m_s=\pm1$ states increases relative to the $m_s=0$ spin, the overall fluorescence intensity will be reduced.

Non-GPS alternative navigation systems, such as those that use intrinsic earth physical measurements, can be useful when GPS is denied or unavailable, and such systems are capable of providing long term navigation for air, land, and/or sea endeavors. Described herein are navigation systems that utilize magnetometers for correction of inertial navigation measurements using an optimal reduced state estimate (ORSE) filter. Such a system can augment current GPS-aided navigation systems and/or provide an alternative navigation solution with similar order of performance to GPS accuracy (e.g., tens of meters compared to single digit meter accuracy with GPS).

Described herein are various applications of an extended ORSE filter utilizing a high grade inertial measurement unit with aid from a vector magnetometer providing periodic earth field measurements. In addition, the systems described herein use a specialized algorithm for processing of the earth magnetic field Enhanced Magnetic Model (EMM) map for increased accuracy. The systems described herein can be implemented independent from a specific magnetometer, but is dependent on the accuracy in the magnetometer measurements, and can achieve near GPS-like performance (e.g., tens of meters' accuracy) when coupled with a high performance magnetometer such as a magneto-optical defect center magnetometer, such as a diamond nitrogen vacancy (DNV) magnetometer.

Figure 3A:
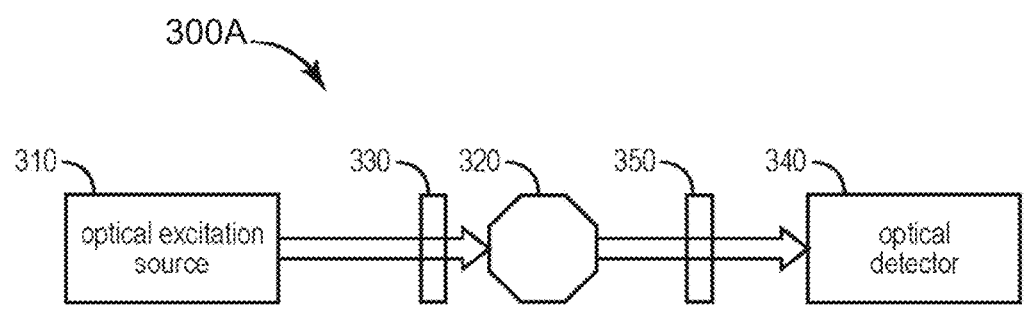
FIG. 3A is a schematic diagram illustrating a NV center magnetic sensor system.

FIG. 3A is a schematic diagram illustrating a NV center magnetic sensor system 300A that uses fluorescence intensity to distinguish the $m_s=\pm1$ states, and to measure the magnetic field based on the energy difference between the $m_s=+1$ state and the $m_s=-1$ state, as manifested by the RF frequencies corresponding to each state. The system 300A includes an optical excitation source 310, which directs optical excitation to an NV diamond material 320 with NV centers. The system further includes an RF excitation source 330, which provides RF radiation to the NV diamond material 320. Light from the NV diamond may be directed through an optical filter 350 to an optical detector 340.

The RF excitation source 330 may be a microwave coil, for example. The RF excitation source 330, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance and a subsequent decrease in fluorescence intensity occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state.

The optical excitation source 310 may be a laser or a light emitting diode, for example, which emits light in the green (light having a wavelength such that the color is green), for example. The optical excitation source 310 induces fluorescence in the red, which corresponds to an electronic transition from the excited state to the ground state. Light from the NV diamond material 320 is directed through the optical filter 350 to filter out light in the excitation band (in the green, for example), and to pass light in the red fluorescence band, which in turn is detected by the optical detector 340. The optical excitation source 310, in addition to exciting fluorescence in the NV diamond material 320, also serves to reset the population of the $m_s=0$ spin state of the ground state $^3A_2$ to a maximum polarization, or other desired polarization.

Figure 4:
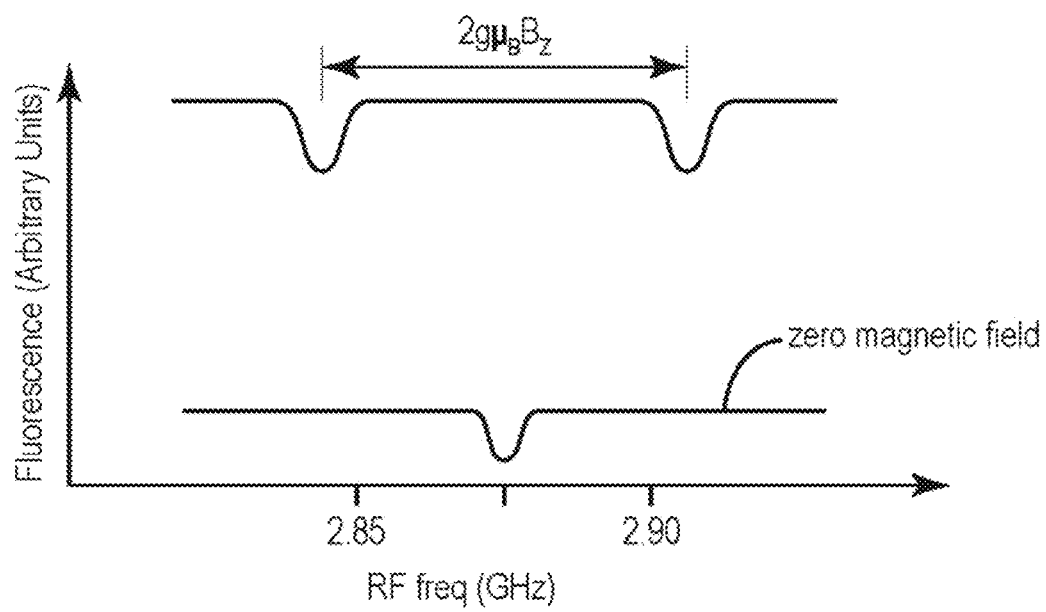
FIG. 4 is a graph illustrating the fluorescence as a function of an applied RF frequency of an NV center along a given direction for a zero magnetic field, and also for a non-zero magnetic field having a component along the NV axis.

For continuous wave excitation, the optical excitation source 310 continuously pumps the NV centers, and the RF excitation source 330 sweeps across a frequency range that includes the zero splitting (when the $m_s=\pm 1$ spin states have the same energy) photon energy of approximately 2.87 GHz. The fluorescence for an RF sweep corresponding to a NV diamond material 320 with NV centers aligned along a single direction is shown in FIG. 4 for different magnetic field components $B_z$ along the NV axis, where the energy splitting between the $m_s=-1$ spin state and the $m_s=+1$ spin state increases with $B_z$. Thus, the component $B_z$ may be determined. Optical excitation schemes other than continuous wave excitation are contemplated, such as excitation schemes involving pulsed optical excitation, and pulsed RF excitation. Examples of pulsed excitation schemes include Ramsey pulse sequence, and spin echo pulse sequence.

Figure 5B:
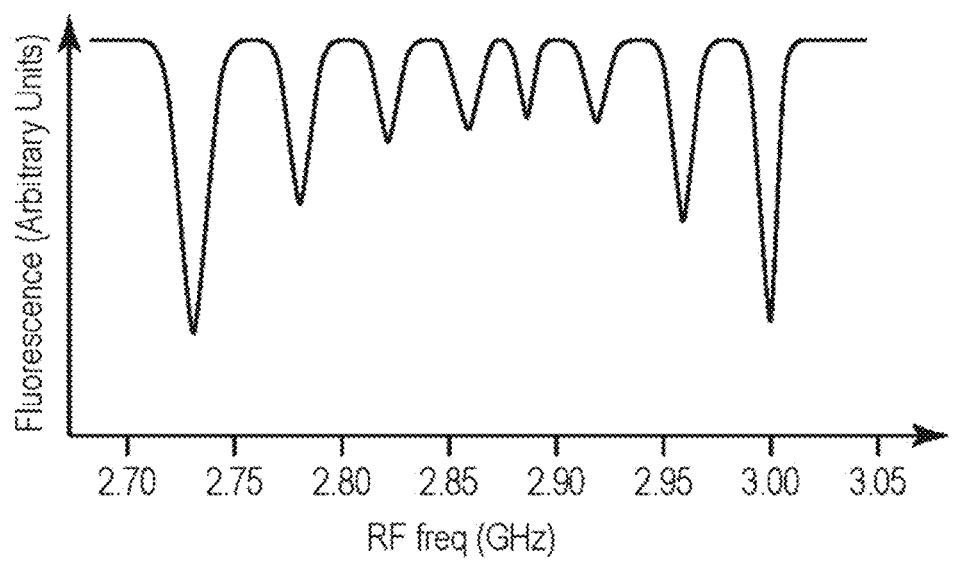
FIG. 5B is a graph illustrating the fluorescence as a function of an applied RF frequency for four different NV center orientations for a non-zero magnetic field.
Figure 5A:
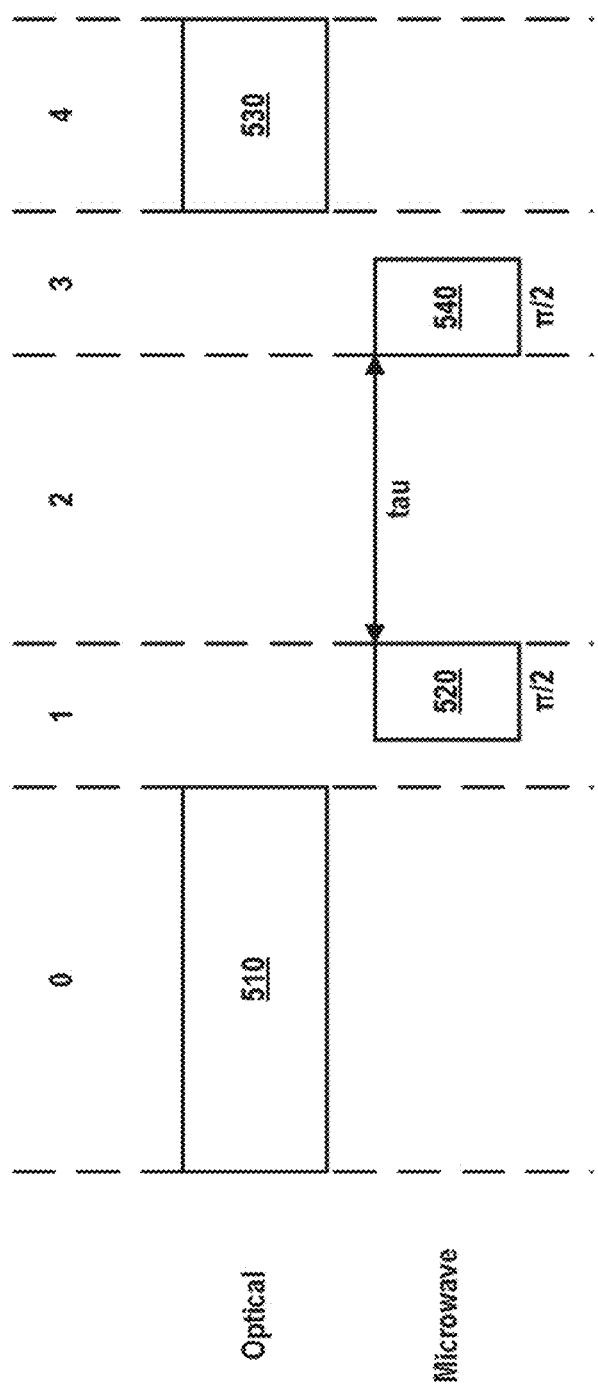
FIG. 5A is a schematic illustrating a Ramsey sequence of optical excitation pulses and RF excitation pulses.

The Ramsey pulse sequence is a pulsed RF-pulsed laser scheme that measures the free precession of the magnetic moment in the NV diamond material 320 with NV centers, and is a technique that quantum mechanically prepares and samples the electron spin state. FIG. 5A is a schematic diagram illustrating the Ramsey pulse sequence. As shown in FIG. 5A, a Ramsey pulse sequence includes optical excitation pulses and RF excitation pulses over a five-step period. In a first step, during a period 0, a first optical excitation pulse 510 is applied to the system to optically pump electrons into the ground state (i.e., $m_s=0$ spin state). This is followed by a first RF excitation pulse 520 (in the form of, for example, a microwave (MW) $\pi/2$ pulse) during a period 1. The first RF excitation pulse 520 sets the system into superposition of the $m_s=0$ and $m_s=+1$ spin states (or, alternatively, the $m_s=0$ and $m_s=-1$ spin states, depending on the choice of resonance location). During a period 2, the system is allowed to freely precess (and dephase) over a time period referred to as tau ($\tau$). During this free precession time period, the system measures the local magnetic field and serves as a coherent integration. Next, a second RF excitation pulse 540 (in the form of, for example, a MW $\pi/2$ pulse) is applied during a period 3 to project the system back to the $m_s=0$ and $m_s=+1$ basis. Finally, during a period 4, a second optical pulse 530 is applied to optically sample the system and a measurement basis is obtained by detecting the fluorescence intensity of the system. The RF excitation pulses applied are provided at a given RF frequency, which correspond to a given NV center orientation.

In general, the NV diamond material 320 will have NV centers aligned along directions of four different orientation classes. FIG. 5B illustrates fluorescence as a function of RF frequency for the case where the NV diamond material 320 has NV centers aligned along directions of four different orientation classes. In this case, the component $B_z$ along each of the different orientations may be determined. These results, along with the known orientation of crystallographic planes of a diamond lattice, allow not only the magnitude of the external magnetic field to be determined, but also the direction of the magnetic field.

Figure 3B:
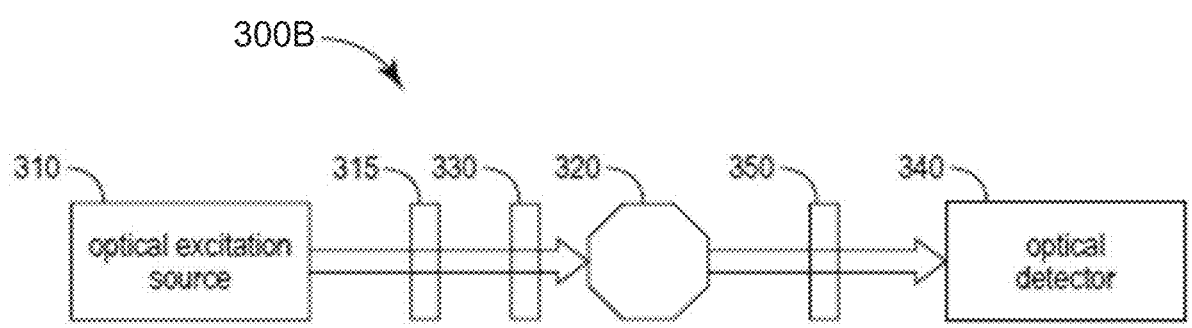
FIG. 3B is a schematic diagram illustrating a NV center magnetic sensor system with a waveplate in accordance with some illustrative embodiments.

FIG. 3B is a schematic diagram illustrating a NV center magnetic sensor system 300B with a waveplate 315. The NV center magnetic sensor system 300B uses fluorescence intensity to distinguish the $m_s=\pm 1$ states, and to measure the magnetic field based on the energy difference between the $m_s=+1$ state and the $m_s=-1$ state. The system 300B includes an optical excitation source 310, which directs optical excitation through a waveplate 315 to a NV diamond material 320 with defect centers (e.g., NV diamond material). The system further includes an RF excitation source 330, which provides RF radiation to the NV diamond material 320. Light from the NV diamond may be directed through an optical filter 350 to an optical detector 340.

In some implementations, the RF excitation source 330 may be a microwave coil. The RF excitation source 330, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state, or between the $m_s=0$ spin state and the $m_s=+1$ spin state, there is a decrease in the fluorescence intensity.

In some implementations, the optical excitation source 310 may be a laser or a light emitting diode which emits light in the green. In some implementations, the optical excitation source 310 induces fluorescence in the red, which corresponds to an electronic transition from the excited state to the ground state. In some implementations, the light from the optical excitation source 310 is directed through a waveplate 315. In some implementations, light from the NV diamond material 320 is directed through the optical filter 350 to filter out light in the excitation band (in the green, for example), and to pass light in the red fluorescence band, which in turn is detected by the optical detector 340. The optical excitation source 310, in addition to exciting fluorescence in the NV diamond material 320, also serves to reset the population of the $m_s=0$ spin state of the ground state $^3A_2$ to a maximum polarization, or other desired polarization.

In some implementations, the light is directed through a waveplate 315. In some implementations, the waveplate 315 may be in a shape analogous to a cylinder solid with an axis, height, and a base. In some implementations, the performance of the system is affected by the polarization of the light (e.g., light from a laser) as it is lined up with a crystal structure of the NV diamond material 320. In some implementations, a waveplate 315 may be mounted to allow for rotation of the waveplate 315 with the ability to stop and/or lock the waveplate 315 in to position at a specific rotation orientation. This allows the tuning of the polarization relative to the NV diamond material 320. Affecting the polarization of the system allows for the affecting the responsive Lorentzian curves. In some implementations where the waveplate 315 is a half-wave plate such that, when a laser polarization is lined up with the orientation of a given lattice of the NV diamond material 320, the contrast of the dimming Lorentzian, the portion of the light sensitive to magnetic fields, is deepest and narrowest so that the slope of each side of the Lorentzian is steepest. In some implementations where the waveplate 315 is a half-wave plate, a laser polarization lined up with the orientation of a given lattice of the NV diamond material 320 allows extraction of maximum sensitivity for the measurement of an external magnetic field component aligned with the given lattice. In some implementations, four positions of the waveplate 315 are determined to maximize the sensitivity to different lattices of the NV diamond material 320. In some implementations, a position of the waveplate 315 is determined to get similar sensitivities or contrasts to the four Lorentzians corresponding to lattices of the NV diamond material 320.

In some implementations where the waveplate 315 is a half-wave plate, a position of the waveplate 315 is determined as an initial calibration for a light directed through a waveplate 315. In some implementations, the performance of the system is affected by the polarization of the light (e.g., light from a laser) as it is lined up with a crystal structure of the NV diamond material 320. In some implementations, a waveplate 315 is mounted to allow for rotation of the waveplate 315 with the ability to stop and/or lock the half-wave after an initial calibration determines the eight Lorentzians associated with a given lattice with each pair of Lorentzians associated with a given lattice plane symmetric around the carrier frequency. In some implementations, the initial calibration is set to allow for high contrast with steep Lorentzians for a particular lattice plane. In some implementations, the initial calibration is set to create similar contrast and steepness of the Lorentzians for each of the four lattice planes. The structural details of the waveplate 315 will be discussed in further detail below.

While FIGS. 3A-3B illustrate an NV center magnetic sensor system 300A, 300B with NV diamond material 320 with a plurality of NV centers, in general, the magnetic sensor system may instead employ a different magneto-optical defect center material, with a plurality of magneto-optical defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material. Magneto-optical defect center materials include but are not limited to diamonds, Silicon Carbide (SiC) and other materials with nitrogen, boron, or other chemical defect centers. Our references to diamond-nitrogen vacancies and diamonds are applicable to magneto-optical defect center materials and variations thereof.

Figure 6A:
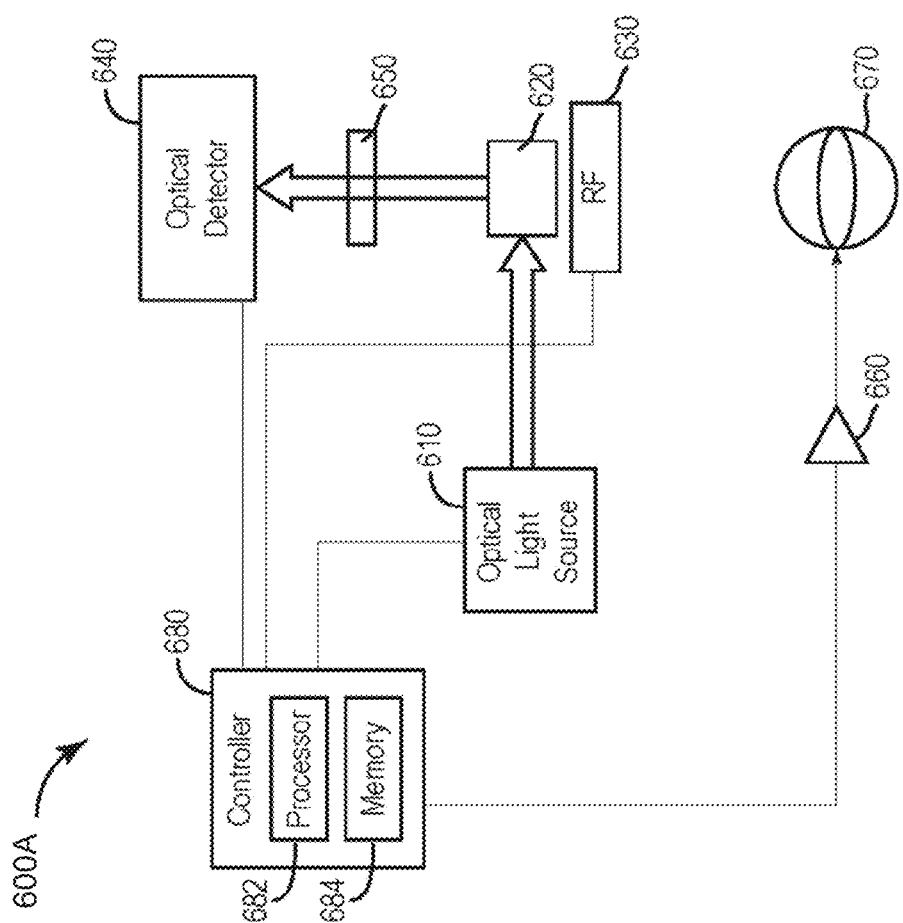
FIG. 6A is a schematic diagram illustrating some embodiments of a magnetic field detection system.

FIG. 6A illustrates a magnetic field detection system 600A according to some embodiments. The system 600A includes an optical light source 610 (i.e., the optical light source 310 of FIGS. 3A and 3B), which directs optical light to an NV diamond material 620 (i.e., the NV diamond material 320 of FIGS. 3A and 3B) with NV centers, or another magneto-optical defect center material with magneto-optical defect centers. An RF excitation source 630 (i.e., the RF excitation source 330 of FIGS. 3A and 3B) provides RF radiation to the NV diamond material 620. The system 600A may include a magnetic field generator 670 which generates a magnetic field, which may be detected at the NV diamond material 620, or the magnetic field generator 670 may be external to the system 600A. The magnetic field generator 670 may provide a biasing magnetic field.

Figure 6B:
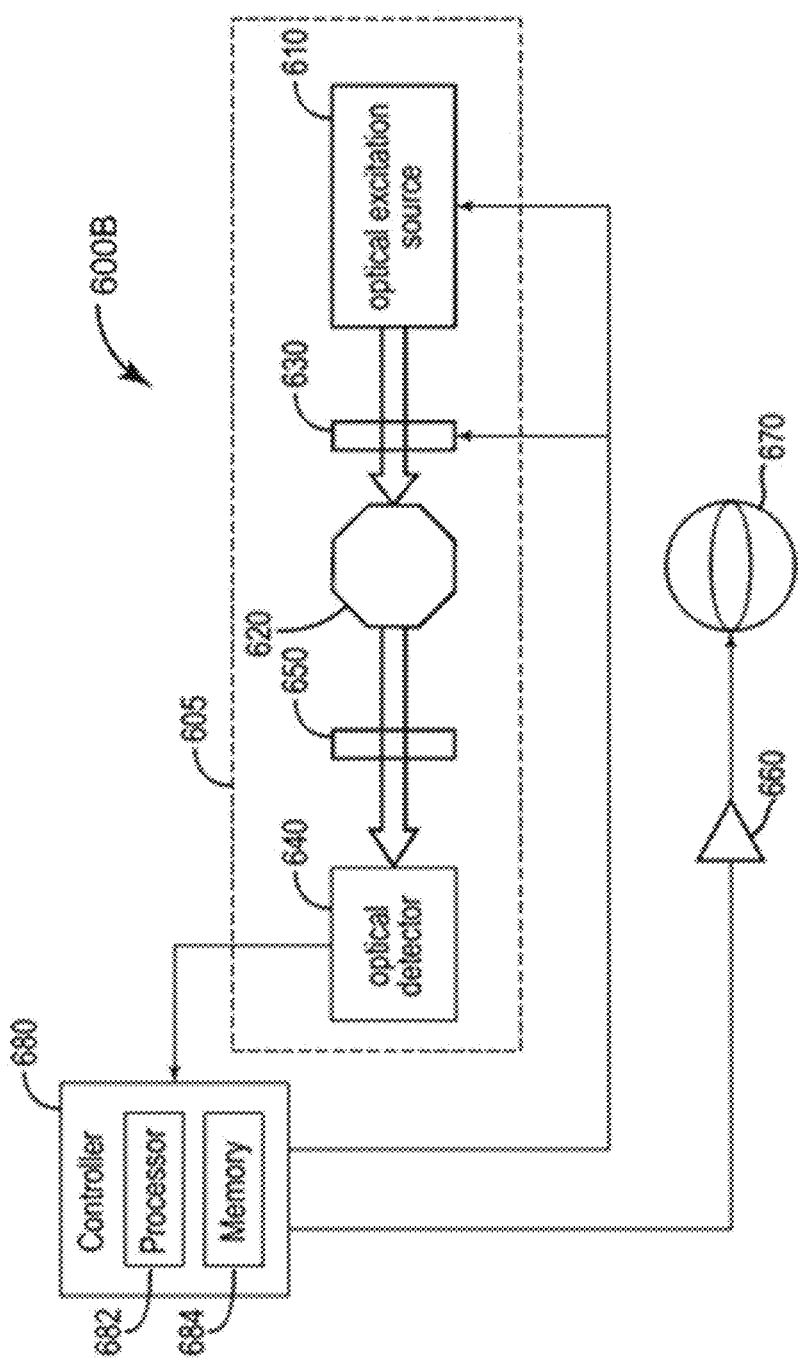
FIG. 6B is another schematic diagram illustrating some embodiments of a magnetic field detection system.

FIG. 6B is another schematic diagram of a magnetic field detection system 600B according to some embodiments. The system 600B includes an optical excitation source 610 (i.e., the optical excitation source 310 of FIGS. 3A and 3B), which directs optical excitation to a NV diamond material 620 (i.e., the NV diamond material 320 of FIGS. 3A and 3B) with defect centers. An RF excitation source 630 (i.e., the RF excitation source 330 of FIGS. 3A and 3B) provides RF radiation to the NV diamond material 620. A magnetic field generator 670 generates a magnetic field, which is detected at the NV diamond material 620.

Referring to both FIGS. 6A and 6B, the system 600A, 600B further includes a controller 680 arranged to receive a light detection signal from the optical detector 640 (i.e., the optical detector 340 of FIGS. 3A and 3B) and to control the optical light source 610, the RF excitation source 630, and the magnetic field generator 670. The controller 680 may be a single controller, or multiple controllers. For a controller 680 including multiple controllers, each of the controllers may perform different functions, such as controlling different components of the system 600A, 600B. The magnetic field generator 670 may be controlled by the controller 680 via an amplifier 660, for example.

The RF excitation source 630 may be controlled to emit RF radiation with a photon energy resonant with the transition energy between the ground $m_s=0$ spin state and the $m_s=\pm 1$ spin states as discussed above with respect to FIG. 3A or 3B, or to emit RF radiation at other nonresonant photon energies.

The controller 680 is arranged to receive a light detection signal from the optical detector 640 and to control the optical light source 610, the RF excitation source 630, and the magnetic field generator 670. The controller 680 may include a processor 682 and a memory 684, in order to control the operation of the optical light source 610, the RF excitation source 630, and the magnetic field generator 670. The memory 684, which may include a nontransitory computer readable medium, may store instructions to allow the operation of the optical light source 610, the RF excitation source 630, and the magnetic field generator 670 to be controlled. That is, the controller 680 may be programmed to provide control.

The magnetic field generator 670 may generate magnetic fields with orthogonal polarizations, for example. In this regard, the magnetic field generator 670 may include two or more magnetic field generators, such as two or more Helmholtz coils. The two or more magnetic field generators may be configured to provide a magnetic field having a predetermined direction, each of which provide a relatively uniform magnetic field at the NV diamond material 620. The predetermined directions may be orthogonal to one another. In addition, the two or more magnetic field generators of the magnetic field generator 670 may be disposed at the same position, or may be separated from each other. In the case that the two or more magnetic field generators are separated from each other, the two or more magnetic field generators may be arranged in an array, such as a one-dimensional or two-dimensional array, for example.

The system 600A may be arranged to include one or more optical detection systems 605, where each of the optical detection systems 605 includes the optical detector 640, optical excitation source 610, and NV diamond material 620. Similarly, the system 600B also includes the optical detector 640, optical excitation source 610, and NV diamond material 620. The magnetic field generator 670 may have a relatively high power as compared to the optical detection systems 605. In this way, the optical systems 605 may be deployed in an environment that requires a relatively lower power for the optical systems 605, while the magnetic field generator 670 may be deployed in an environment that has a relatively high power available for the magnetic field generator 670 so as to apply a relatively strong magnetic field.

The RF excitation source 630 may be a microwave coil, for example behind the light of the optical excitation source 610. The RF excitation source 630 is controlled to emit RF radiation with a photon energy resonant with the transition energy between the ground $m_s=0$ spin state and the $m_s=\pm 1$ spin states as discussed above with respect to FIGS. 3A and 3B.

The optical excitation source 610 may be a laser or a light emitting diode, for example, which emits light in the green, for example. The optical excitation source 610 induces fluorescence in the red from the NV diamond material 620, where the fluorescence corresponds to an electronic transition from the excited state to the ground state. Light from the NV diamond material 620 is directed through the optical filter 650 to filter out light in the excitation band (in the green, for example), and to pass light in the red fluorescence band, which in turn is detected by the optical detector 640. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 is arranged to receive a light detection signal from the optical detector 640 and to control the optical excitation source 610, the RF excitation source 630, and a second magnetic field generator (not illustrated). The controller may include a processor 682 and a memory 684, in order to control the operation of the optical excitation source 610, the RF excitation source 630, and the second magnetic field generator. The memory 684, which may include a nontransitory computer readable medium, may store instructions to allow the operation of the optical excitation source 610, the RF excitation source 630, and the second magnetic field generator to be controlled. That is, the controller 680 may be programmed to provide control.

Figure 6C:
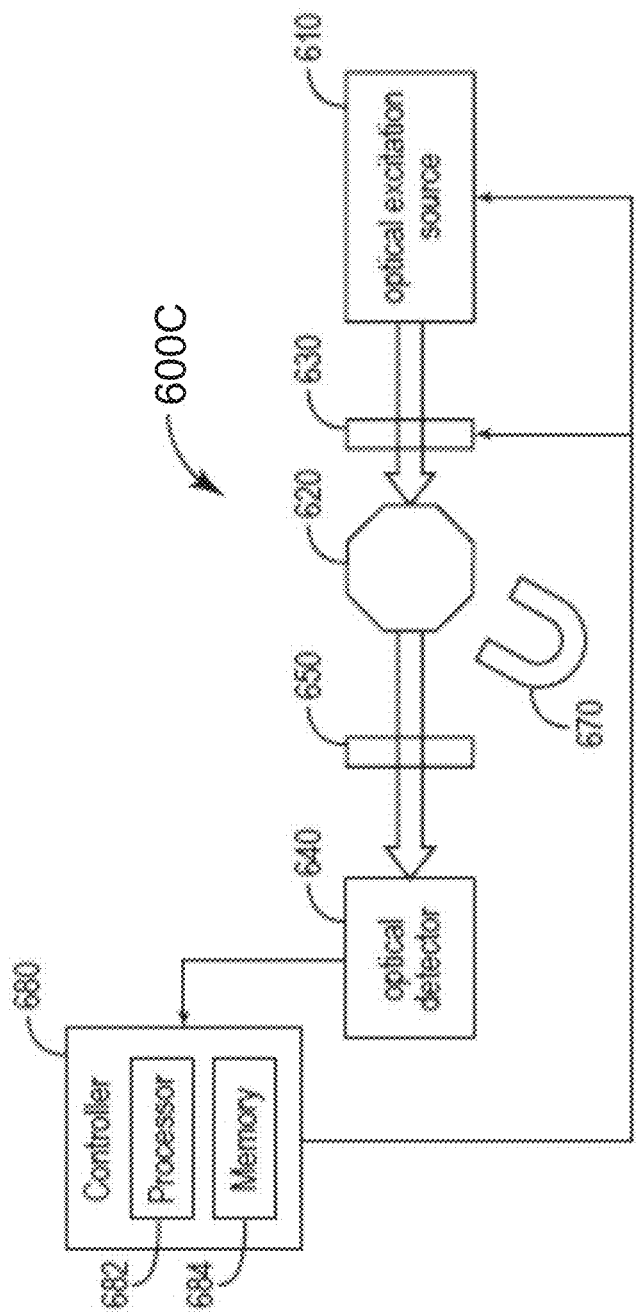
FIG. 6C is another schematic diagram illustrating some embodiments of a magnetic field detection system.

FIG. 6C is a schematic of an NV center magnetic sensor system 600C, according to some embodiments. The sensor system 600C includes an optical excitation source 610, which directs optical excitation to an NV diamond material 620 with NV centers, or another magneto-optical defect center material with magneto-optical defect centers. An RF excitation source 630 provides RF radiation to the NV diamond material 620. The NV center magnetic sensor system 600C may include a bias magnet (bias magnetic field generator 670) applying a bias magnetic field to the NV diamond material 620. Unlike FIGS. 6A and 6B, the sensor system 600C of FIG. 6C does not include the amplifier 660. However, in some implementations of the NV center magnetic sensor system 600C, an amplifier 660 may be utilized. Light from the NV diamond material 620 may be directed through an optical filter 650 and optionally, an electromagnetic interference (EMI) filter (not illustrated), which suppresses conducted interference, to an optical detector 640. The sensor system 600C further includes a controller 680 arranged to receive a light detection signal from the optical detector 640 and to control the optical excitation source 610 and the RF excitation source 630.

The optical excitation source 610 may be a laser or a light emitting diode, for example, which emits light in the green, for example. The optical excitation source 610 induces fluorescence in the red, which corresponds to an electronic transition from the excited state to the ground state. Light from the NV diamond material 620 is directed through the optical filter 650 to filter out light in the excitation band (in the green for example), and to pass light in the red fluorescence band, which in turn is detected by the optical detector 640. In implementations including the EMI filter, the EMI filter is arranged between the optical filter 650 and the optical detector 640 and suppresses conducted interference. The optical excitation light source 610, in addition to exciting fluorescence in the NV diamond material 620, also serves to reset the population of the $m_s=0$ spin state of the ground state $^3A_2$ to a maximum polarization, or other desired polarization.

Figure 7:
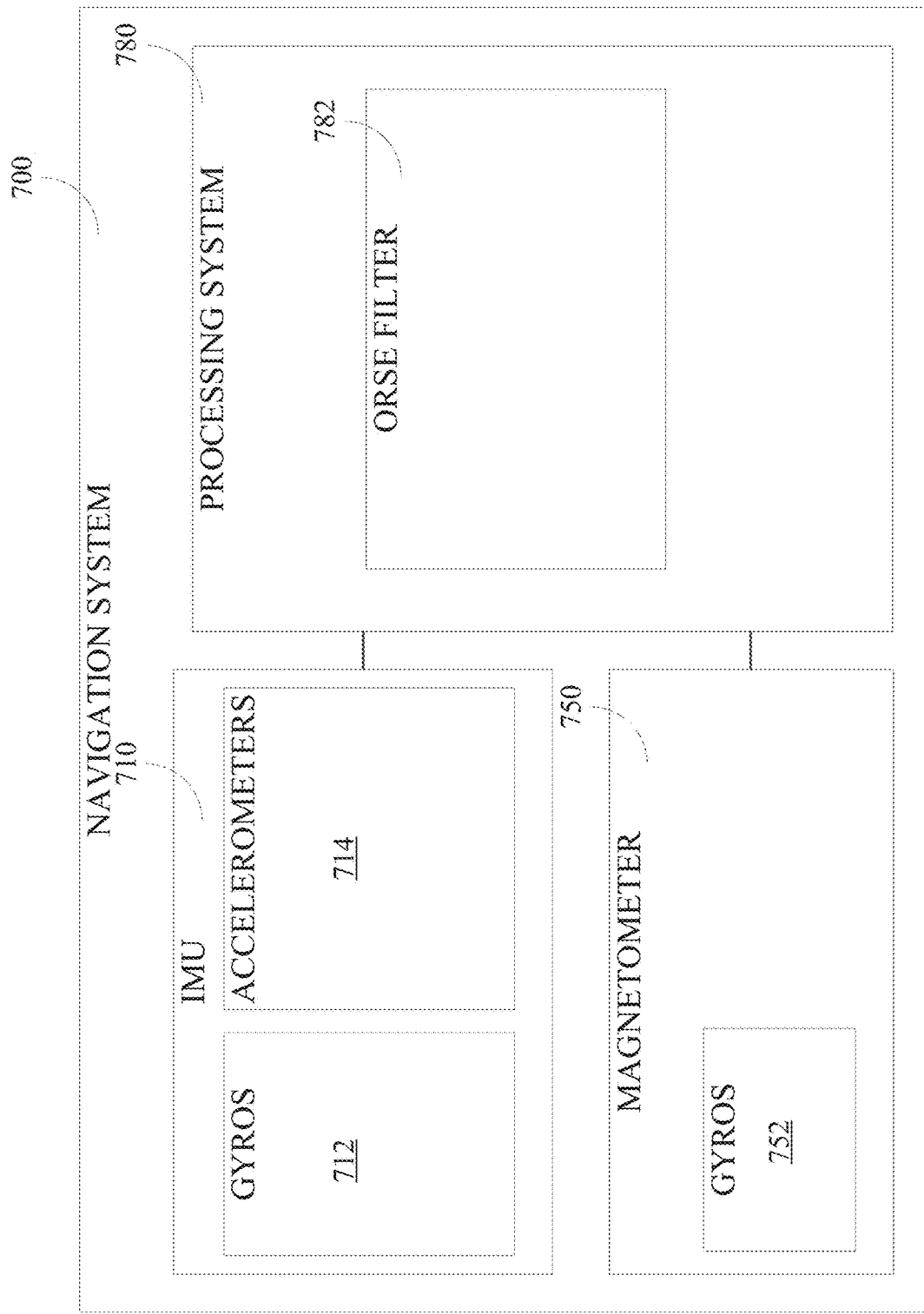
FIG. 7 is a block diagram of an inertial navigation system with a magnetometer in accordance with some illustrative embodiments.

Referring to FIG. 7, an inertial navigation system 700 is depicted with an inertial measurement unit 710, a magnetometer 750, and a processing system 780. The inertial measurement unit 710 can include one or more gyros 712 and one or more accelerometers 714. In some implementations, the inertial measurement unit 710 can include three gyros 712 and three accelerometers 714 arranged in a 3-axis orthogonal arrangement. The gyros 712 and accelerometers 714 measure absolute change in angular orientation, $\Delta\theta$, and/or velocity, $\Delta\underline{V}$, and/or angular rate. The inertial navigation system 700 includes a processing system 780 that receives the output or measured change in velocity, $\Delta\underline{V}_I^m$, and/or change in angular orientation, $\Delta\underline{\theta}_I^m$, from the inertial measurement unit 710 and to be used to update the position of the object for which the navigational system 700 is implemented.

The inertial navigation system 700 also includes a magnetometer 750 that can measure an Earth magnetic field vector, $\underline{B}_{EC}(\underline{X}_{EC})$, which is in an Earth centered reference frame. The magnetometer 750 can be any type of magnetometer, but can include a magneto-optical defect center magnetometer, such as a diamond having a nitrogen vacancy magnetometer. The magnetometer 750 can also include one or more gyros 752, such as three orthogonal gyros, to provide a reference orientation internal to the magnetometer 750. The processing system 780 also receives the output or measured magnetic field, $\underline{B}_M^m$, from the magnetometer 750 and to be used to update a position of the object for which the navigational system 700 is implemented.

The processing system 780 utilizes several reference frame transformations to convert the measured change in velocity, $\Delta\underline{V}_I^m$, and/or change in angular orientation, $\Delta\underline{\theta}_I^m$, from the inertial measurement unit 710 from the sensor platform reference frame to an Earth inertialized reference frame. Similarly, the processing system 780 utilizes several reference frame transformations to convert the measured magnetic field, $\underline{B}_M^m$, from the magnetometer 750 from the sensor platform reference frame to an Earth inertialized reference frame.

The measured change in velocity, $\Delta\underline{V}_I^m$, and/or change in angulate rate, $\Delta\underline{\theta}_I^m$, from the inertial measurement unit 710 are first converted by a transform, $T_I^{SP}$, based on the sensor platform. The measured magnetic field, $\underline{B}_M^m$, from the magnetometer 750 is also first converted by a transform, $T_M^{SP}$, based on the sensor platform. Thus, the measured change in velocity, change in angular orientation, and Earth magnetic field are all transformed to correct for the positioning of the inertial measurement unit 710 and the magnetometer 750 of the navigational system 700. The sensor platform transformed measured change in velocity, change in angular orientation, and Earth magnetic field are all transformed using an East-North-Down transformation, $T_{SP}^{EN}$, and then transformed using an Earth-Centered-Fixed transformation, $T_{EN}^{EC}$.

The processing system 780 determines a difference, $\Delta\underline{B}_i^m$, between an expected magnetic field measurement, $\hat{y}_i^{map}$, and an actual magnetic field measurement, $\hat{y}_i^m$ at time $t_i$. The difference can be a longitude and/or latitude difference or could be any other comparable reference value based on the expected magnetic field measurement from the Earth Magnetic Field map. The actual magnetic field measurement from the magnetometer 750 can be represented by, $\underline{y}_i^m = \underline{B}_{EC}^m + \hat{T}_M^{EC}\underline{\eta}_M + \hat{T}_M^{EC}\underline{b}_M$ where $\eta$ represents Gaussian noise and b bias. The expected magnetic field measurement based on the Earth Magnetic Field map can be represented by $\underline{y}_i^{map} = \underline{B}_{EC}^{map}(\hat{T}_{EC}^{EI}\hat{\underline{X}}_{EI}) + (\eta(IE)_{EC}^{map} + \underline{b}_{EC}^{map})$ where $\eta(IE)$ represents interpolation noise error and $b$ bias in the map indexing.

Thus, the difference, $\Delta \underline{y}_i^m$, can be determined as $$\Delta \underline{y}_i^m = \underline{y}_i^m - \underline{y}_i^{map} = [J]_i^{map} \Delta \hat{\underline{X}}_{EC} + \hat{T}_M^{EC} \underline{\eta}_M + \hat{T}_M^{EC} \underline{b}_M - \hat{T}_{EC}^{EC}(\underline{IE}_{EC}^{map} + \underline{b}_{EC}^{map}).$$

The difference can be simplified to $$\Delta \underline{y}_i^m = H \Delta \underline{z}_i + N \underline{\eta}_i + \Gamma \underline{b}_i$$

where $$[J]_i^{map} = \frac{\partial \underline{B}_{EC}^{map}(\underline{X}_{EC})}{\partial \underline{X}_{EC}}$$

$$H = [[J]_i^{map} \, 0_{3 \times 10}],$$

$$N = [\hat{T}_M^{EI} - \hat{T}_{EC}^{EI}],$$

$$\Gamma = [\hat{T}_M^{EI} - \hat{T}_{EC}^{EI}],$$

$$\underline{\eta}_i = \left\{ \begin{array}{c} \underline{\eta}_M \\ \underline{IE}_{EC}^{map} \end{array} \right\},$$

$$\underline{b}_i = \left\{ \begin{array}{c} \underline{b}_M \\ \underline{b}_{EC}^{map} \end{array} \right\}, \text{ and}$$

$$\Delta \underline{z}_i = \left\{ \begin{array}{c} \Delta \underline{S}_i \\ \Delta \underline{\theta}_i \end{array} \right\}_i$$

Note the magnetometer map $\underline{B}_{EC}^{map}$ has been transformed from the default NED coordinates to ECEF coordinates: $\underline{B}_{EC}^{map}(Lat_i, Lon_j) = \hat{T}_{EN}^{EC}(Lat_i, Lon_j) \otimes \underline{B}_{EN}^{map}(Lat_i, Lon_j)$, for all $i$ latitude and $j$ longitude grid points. Where the operator $\otimes$ denotes an element by element transformation. For example, For $Lat_{i12}$ and $Lon_{23}$, $$\underline{B}_{EC}^{map}(Lat_i, Lon_j) = \left\{ \begin{array}{c} B_{EC}^{map}(x) \\ B_{EC}^{map}(y) \\ B_{EC}^{map}(z) \end{array} \right\}_{ij} = \hat{T}_{EN}^{EC}(Lat_i, Lon_j) \left\{ \begin{array}{c} B_{EN}^{map}(n) \\ B_{EN}^{map}(e) \\ B_{EN}^{map}(d) \end{array} \right\}_{ij}$$

By utilizing the ECEF coordinates to represent the Map, increased observability into the estimation states are achieved, thereby enhancing the navigation performance with respect to current state of the art algorithms using maps.

The difference, $\Delta \underline{y}_i^m$, is then utilized by the ORSE filter 782 for updating the time propagation of state and covariance with the measurement update of the state and covariance to determine a state estimate of the object for which the navigation system 700 is implemented, as will be described in greater detail below. The magnetometer 750 is thus used with the Earth-Centered-Earth-Fixed reference frame to correct for drift or other errors from the inertial measurement unit 710.

These implementations can also permit the ability to process normalized measurements $$\Delta \hat{\underline{y}}_i^m = \hat{\underline{y}}_i^m - \hat{\underline{y}}_i^{map} =$$

$$\frac{(I - \underline{B}_{EC}^{map} \underline{B}_{EC}^{mapT})}{\|\underline{B}_{EC}^{map}\|} [J]_i^{map} \Delta \hat{\underline{X}}_{EC} + \frac{\hat{T}_M^{EC} \underline{\eta}_M + \hat{T}_M^{EC} \underline{b}_M - \hat{T}_{EC}^{EC}(\underline{IE}_{EC}^{map} + \underline{b}_{EC}^{map})}{\|\hat{\underline{X}}_{EC}\|}.$$

Normalized magnetometer measurements mitigate the magnitude errors induced during magnetometer calibration while still allowing for estimation of angular errors due to Latitude and Longitude errors.

In some embodiments, the following formulation may be used for Earth magnetic field map processing. First, the $\underline{B}_{EP}^{map}$ can be selected for day of year and time of day. Second, the state position solution may be decomposed into latitude, longitude, and altitude ($\hat{\underline{X}}_{EC} \rightarrow$ (Lat, Long, Alt). Third, the into latitudes ($Lat_j(\varphi_j)$ and $Lat_{j+1}(\varphi_{j+1})$), longitude ($Lon_i(\lambda_i)$, $Lat_{i+1}(\lambda_i)$), and latitude ($Alt_k$ and $Alt_{k+1}$) may be located variables $\eta$, $\xi$, and $\zeta$ may be computed from the following formulation:

$$\eta = (\varphi - \varphi_j)/(\varphi_{j+1} - \varphi_j)$$

$$\xi = (\lambda - \lambda_i)/(\lambda_{i+1} - \lambda_i)$$

$$\zeta = (Alt - Alt_k)/(Alt_{k+1} - Alt_k)$$

Next, the shape functions may be defined for example along the eight directions:

$$N_1 = \tfrac{1}{8}(1-\xi)(1-\eta)(1-\zeta)$$

$$N_2 = \tfrac{1}{8}(1+\xi)(1-\eta)(1-\zeta)$$

$$N_3 = \tfrac{1}{8}(1+\xi)(1+\eta)(1-\zeta)$$

$$N_4 = \tfrac{1}{8}(1-\xi)(1+\eta)(1-\zeta)$$

$$N_5 = \tfrac{1}{8}(1-\xi)(1-\eta)(1+\zeta)$$

$$N_6 = \tfrac{1}{8}(1+\xi)(1-\eta)(1+\zeta)$$

$$N_7 = \tfrac{1}{8}(1+\xi)(1+\eta)(1+\zeta)$$

$$N_8 = \tfrac{1}{8}(1-\xi)(1+\eta)(1+\zeta)$$

The magnetic field can be then computed by interpolating the three-dimensional map using the shape functions:

$$B_{EC}^{map}(x) = \sum_{i=1}^{8} N_i(\xi, \eta, \zeta) B_{EC}^{map}(x_i)$$

$$B_{EC}^{map}(y) = \sum_{i=1}^{8} N_i(\xi, \eta, \zeta) B_{EC}^{map}(y_i)$$

$$B_{EC}^{map}(z) = \sum_{i=1}^{8} N_i(\xi, \eta, \zeta) B_{EC}^{map}(z_i)$$

The following Jacobian may be used in computing the magnetic field:

$$[J]_i^{map} = \frac{\partial \underline{B}_i^{map} \rightarrow (x_{EC})}{\partial \underline{x}_{EC}} = \left[ \begin{array}{c} \left[ \frac{\underline{B}_i^{map}(\underline{X}_{EC} + \Delta \underline{X}_1) - \underline{B}_i^{map}(\underline{X}_{EC})}{\Delta X_1} \right]^t \\ \left[ \frac{\underline{B}_i^{map}(\underline{X}_{EC} + \Delta \underline{X}_2) - \underline{B}_i^{map}(\underline{X}_{EC})}{\Delta X_2} \right]^t \\ \left[ \frac{\underline{B}_i^{map}(\underline{X}_{EC} + \Delta \underline{X}_3) - \underline{B}_i^{map}(\underline{X}_{EC})}{\Delta X_3} \right]^t \end{array} \right]^t$$

where $$\Delta \underline{X}_1 = \left\{ \begin{array}{c} \Delta X_1 \\ 0 \\ 0 \end{array} \right\}, \Delta \underline{X}_2 = \left\{ \begin{array}{c} 0 \\ \Delta X_2 \\ 0 \end{array} \right\}, \Delta \underline{X}_3 = \left\{ \begin{array}{c} 0 \\ 0 \\ \Delta X_3 \end{array} \right\}$$

-continued $$\Delta \underline{y}_i = \frac{\partial \Delta \underline{y}_i(\underline{z})}{\partial \underline{z}} \Delta \underline{z}_i + N\underline{n}_i + \Gamma \underline{b}_i = H\Delta z_i + N\underline{n}_i + \Gamma \underline{b}_i$$

$$H = \frac{\partial \Delta \underline{y}_i(\underline{z})}{\partial \underline{z}} = [-[J]_i^{map}|0_{3\times 3}|\partial \Delta \underline{y}_i(\underline{\theta}_{EI})/\partial \underline{\theta}_{EI}]$$

where $$\Delta \underline{X}_{EC} = [-J]_i^{map}$$

$$\Delta \underline{\dot{X}}_{EC} = 0_{3\times 3}$$

$$\Delta \underline{\theta}_{EI} = \partial \Delta \underline{y}_i(\underline{\theta}_{EI})/\partial \underline{\theta}_{EI}$$

$$\Delta z_i = \begin{Bmatrix} \Delta \underline{X}_{EC} \\ \Delta \underline{\dot{X}}_{EC} \\ \Delta \underline{\theta}_{EI} \end{Bmatrix}$$

Figure 8:
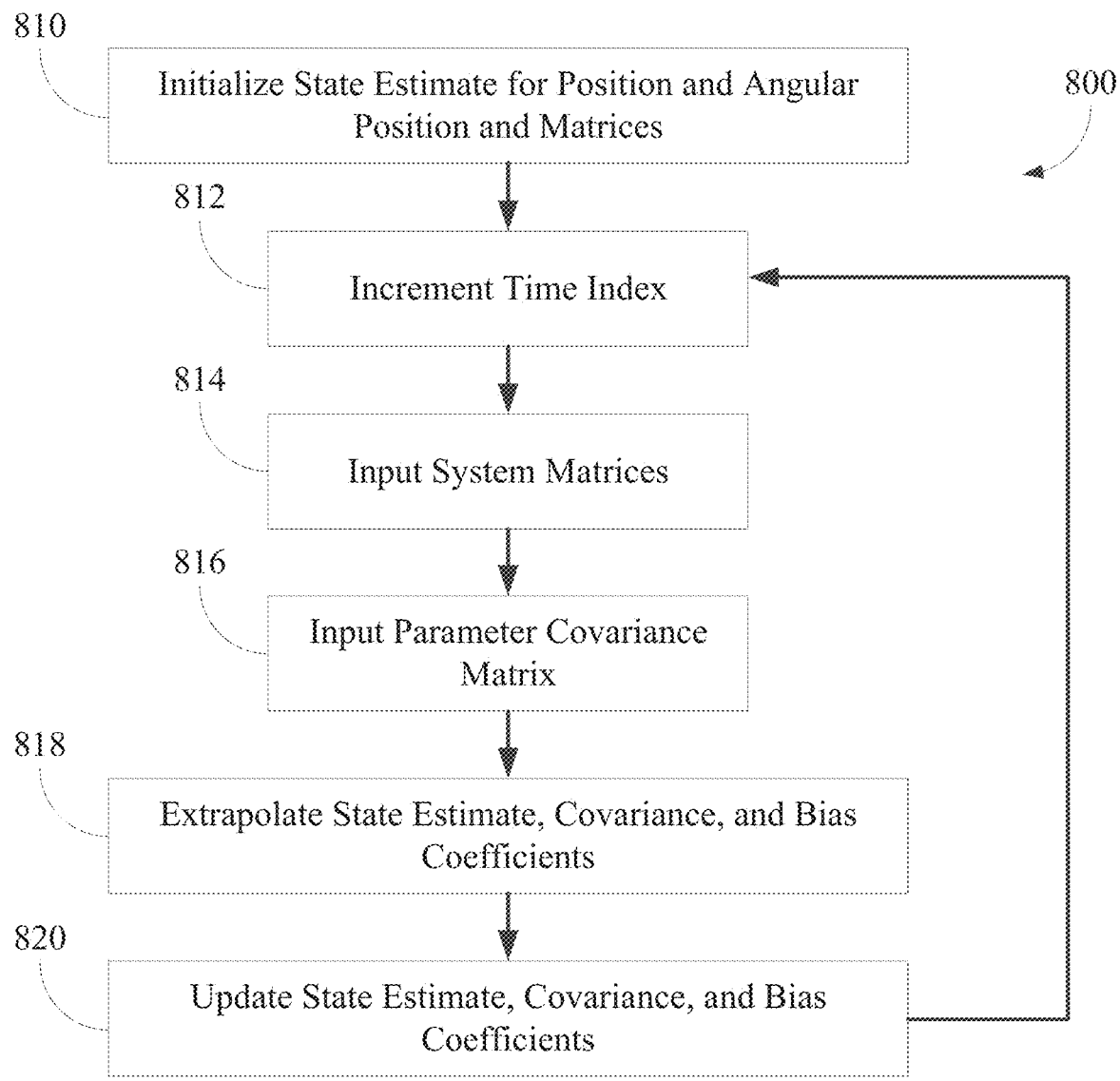
FIG. 8 is a simplified logic flow chart for processing associated with a reduced-state estimator in accordance with some illustrative embodiments.

The logic flow chart of FIG. 8 illustrates a process 800 that begins with initialization 810 of a state estimates, $$\underline{S}_0 = \begin{Bmatrix} \hat{\underline{X}}_{EC} \\ \hat{\underline{\dot{X}}}_{EC} \end{Bmatrix}_0$$

for position and $\underline{\theta}_0 = \{\underline{\theta}_{EI}^I\}_0$ for angular position at time t=0, and the matrices M, D, and E. Matrix M is the covariance of the state estimation errors at time i due only to the errors in the measurements and a priori initial information that is independent of the parameter uncertainty. Matrix D is a matrix of the un-modelled acceleration bias variances, which linearly relates state estimation errors to the un-modelled acceleration bias induced errors, at time t (after processing i=0, 1, 2, ... measurements). Matrix E is a matrix of un-modelled measurement bias variances, which linearly relates state estimation errors to the un-modelled measurement bias induced errors. From block 810, the process 800 flows to a block 812, which represents the incrementing of a time index t to t+1. The process 800 flows to a further block 814, which represents the accessing or inputting of system matrices. From block 814, the process 800 flows to a block 816, which accesses or inputs a parameter matrix Λ. The parameter matrix A represents the physical bounds on the unknown parameters, such as velocity and angular rate, and is preferably selected based on a precise description of the physical system, and depends upon well-known physical phenomena and characteristics of real systems.

From block 816 of FIG. 8, the process 800 proceeds to a block 818, which represents the extrapolation of state estimates and matrices. The time propagation of the state can be determined by $$\underline{S}_1 = \begin{Bmatrix} \hat{\underline{X}}_{EC} \\ \hat{\underline{\dot{X}}}_{EC} \end{Bmatrix}_i,$$

$$\underline{\theta}_i = \{\underline{\theta}_{EI}\}_i,$$

$$\underline{\dot{S}}_i = \begin{Bmatrix} \hat{\underline{\dot{X}}}_{EI} \\ f_{\dot{X}}(\underline{S}_i, \underline{\theta}_i, \Delta \underline{V}_{EI}^m) \end{Bmatrix}_i,$$

$$\underline{\dot{\theta}}_i = \{\hat{T}_I^{EC} \Delta \underline{\theta}_I^m / \Delta t\}_i.$$

The update to the position, S, can be calculated as $$\underline{S}_{i+1} = \underline{S}_i + \int_{t_i}^{t_{i+1}} \underline{\dot{S}}_i dt.$$

Similarly, the update to the angular position θ can be calculated as $$\underline{\theta}_{i+1} = \underline{\theta}_i + \int_{t_i}^{t_{i+1}} \underline{\dot{\theta}}_i dt.$$

The transform for an Earth-Centered-Fixed reference frame from the East-North-Down reference frame can be based on the World Geodetic System (WGS) 84 model and can be represented by $\hat{T}_{EN}^{EC} = f_{wgs-84}(\hat{\underline{X}}_{EC})$. The transform for an Earth-Centered-Inertial reference frame from the Earth-Centered-Fixed reference frame can be $\hat{T}_{EC}^{EI} = \bar{T}_{EI}^{EC}(\Omega(t_{i+1}-t_0))$. The transform for the sensor platform reference frame from the Earth-Centered-Inertial reference frame can be $\hat{T}_{EI}^{SP} = \hat{T}_I^{SP} f_{\in}(\underline{\theta}_{EI}^I)$. The transform for the East-North-Down reference frame from the sensor platform can be $\hat{T}_{SP}^{EN} = \hat{T}_{EN}^{EC^t} \hat{T}_{EC}^{EI^t} \hat{T}_{EI}^{SP}$. The time propagation of the covariance for the matrices M, D, and E can be determined where $M(i+1|-) = FM(i|+)F^T$, $D(i+1|-) = FD(i|+) + G$, and $E(i+1|-) = FE(i|+)$.

At block 820, the state and covariance are updated based on the measurements and the error, $\hat{\underline{z}}$, is updated using the difference, $\Delta \underline{y}_i^m$. The state and covariance are updated where $V = HE(i+1|-) + I_{3\times 3}$ (where I is a three-by-three identity matrix), $P = M(i+1|-) + D(i+1|-)\Lambda D(i+1|-)^t$, $Q = HPH^t + V\Sigma_b V^t + N\Sigma_n N^t$, $U = PH^t + E(i+1|-)\Sigma_b V^t$, $\Sigma_n = E(\underline{n}_{i+1}\underline{n}_{i+1}^t)$, $\Sigma_b = E(\underline{b}_i \underline{b}_i^t)$, $K = M(i+1|-)H^t(Q)^{-1}$, $M(i+1|+) = (I-KH)M(i+1|-)(I-KH)^T + KN\Sigma_{n_{i+1}}N^t K^t$, $D(i+1|+) = (I-KH)D(i+1|-)$, $E(i+1|+) = (I-KH)E(i+1|-) - KJ$, and $\hat{\underline{z}}(i+1|-) = \hat{\underline{z}}(i+1|-) + K(\Delta \underline{y}_{i+1}^m)$.

The process 800 can repeat by returning to block 812, which represents the incrementing of a time index again from the new t to a new t+1.

The ORSE filtering process 800 can be further configured based on the teachings described in U.S. Pat. No. 7,180,443 entitled "Reduced state estimator for systems with physically bounded parameters" issued Feb. 20, 2007, the contents of which are hereby incorporated by referenced in their entirety.

Figure 9:
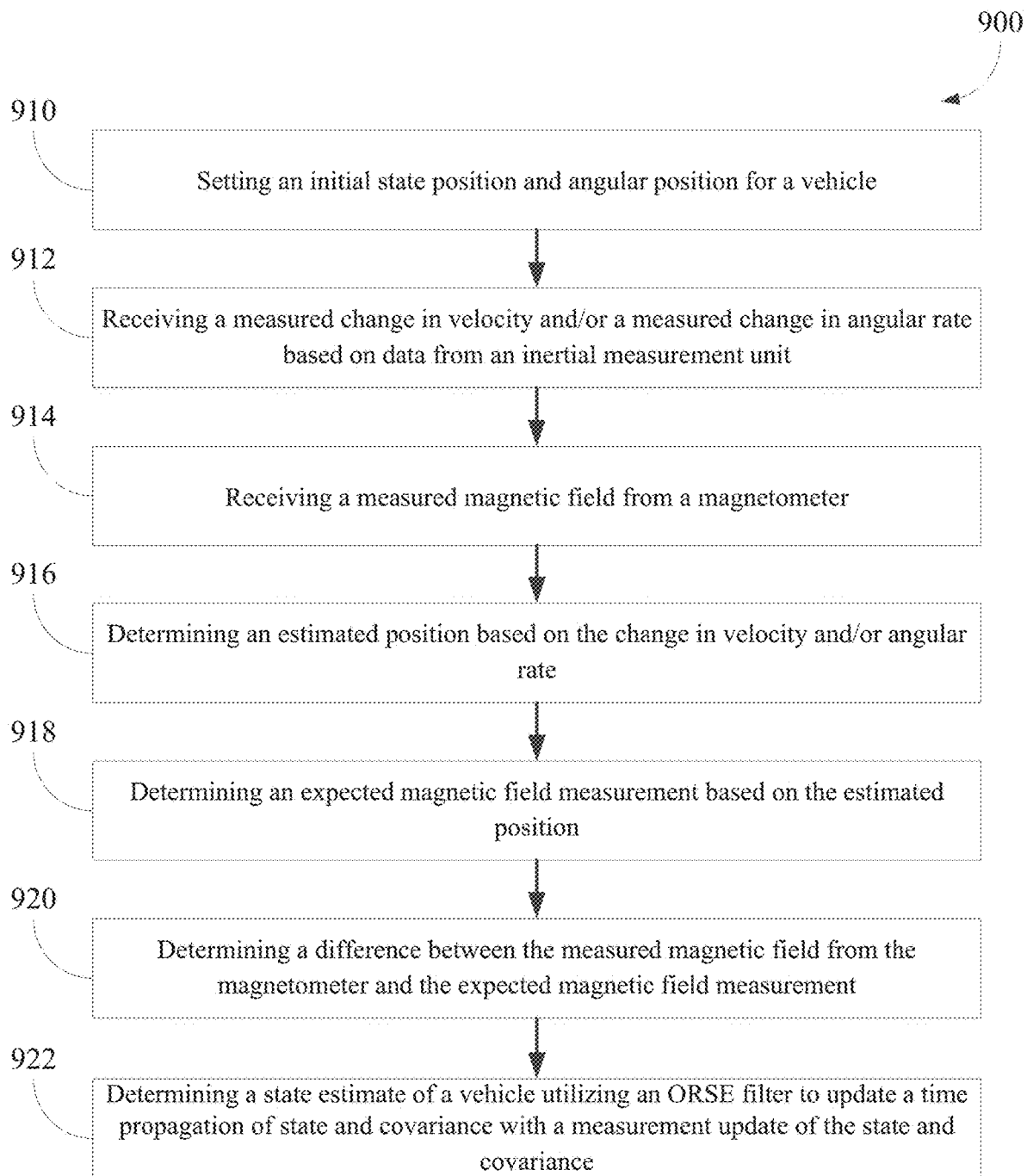
FIG. 9 is a process diagram for navigation using the system of FIG. 7 in accordance with some illustrative embodiments.

FIG. 9 depicts an example process 900 for navigation using the navigational system 700 of FIG. 7. The process 900 includes setting an initial state position and angular position for a vehicle (block 910). The initial state position can be an initial position of a vehicle at a longitudinal position and latitudinal position. The angular position can be an angular orientation of the vehicle relative to Earth. Other suitable reference frames and/or other reference values other than longitude, latitude, and/or altitude may be utilized. In some implementations, the vehicle is a rotary wing aircraft, a fixed wing aircraft, a ship, a spacecraft, a motor vehicle, a robotic vehicle, a projectile, etc.

The process 900 includes receiving a measured change in velocity and/or a measured change in angular rate based on data from an inertial measurement unit (block 912). The measured change in velocity and/or change in angular rate may be based on measurements from one or more gyros and/or accelerometers of the inertial measurement unit. In some implementations, the inertial measurement unit can include three gyros and three accelerometers arranged in a 3-axis orthogonal arrangement. The gyros and accelerometers can measure an absolute velocity and/or angular rate and/or a change in velocity and/or angular rate. In some implementations, the velocities and angular rate changes are in an Earth-centered inertial reference frame.

The process 900 further includes receiving a measured magnetic field from a magnetometer (block 914). The magnetometer can be any type of magnetometer, but can include a magneto-optical defect center magnetometer, such as a diamond having a nitrogen vacancy magnetometer. The magnetometer can also include one or more gyros, such as three orthogonal gyros, to provide a reference position for the magnetometer.

The process 900 further includes determining an estimated position based on the change in velocity and/or angular rate (block 916). The estimated position can be a longitudinal position and latitudinal position based on a time stepped increment using the change in velocity and/or angular rate. The process 900 also includes determining an expected magnetic field measurement based on the estimated position (block 918). The expected magnetic field measurement may be one or more parameter values from a reference table such as a reference table of reference magnetic field measurements based on longitudinal and latitudinal position from an Earth Magnetic Field map, such as the Enhanced Magnetic Model (EMM) map.

The process 900 includes determining a difference between the measured magnetic field from the magnetometer and the expected magnetic field measurement (block 920). The process 900 further includes determining a state estimate of a vehicle utilizing an ORSE filter to update a time propagation of state and covariance with a measurement update of the state and covariance (block 922). During the process 900, the measured change in velocity and/or change in angulate rate from the inertial measurement unit are transformed from a sensor platform reference frame to an Earth-centered inertial reference frame and the measured magnetic field from the magnetometer is transformed from the magnetometer reference frame to the Earth-centered inertial reference frame. The Earth-Centered-Inertial reference frame provides improved correction for drift or other errors from the inertial measurement unit when utilizing the difference between the measured magnetic field from the magnetometer and the expected magnetic field measurement with ORSE filtering.

EXAMPLES

Figure 10A:
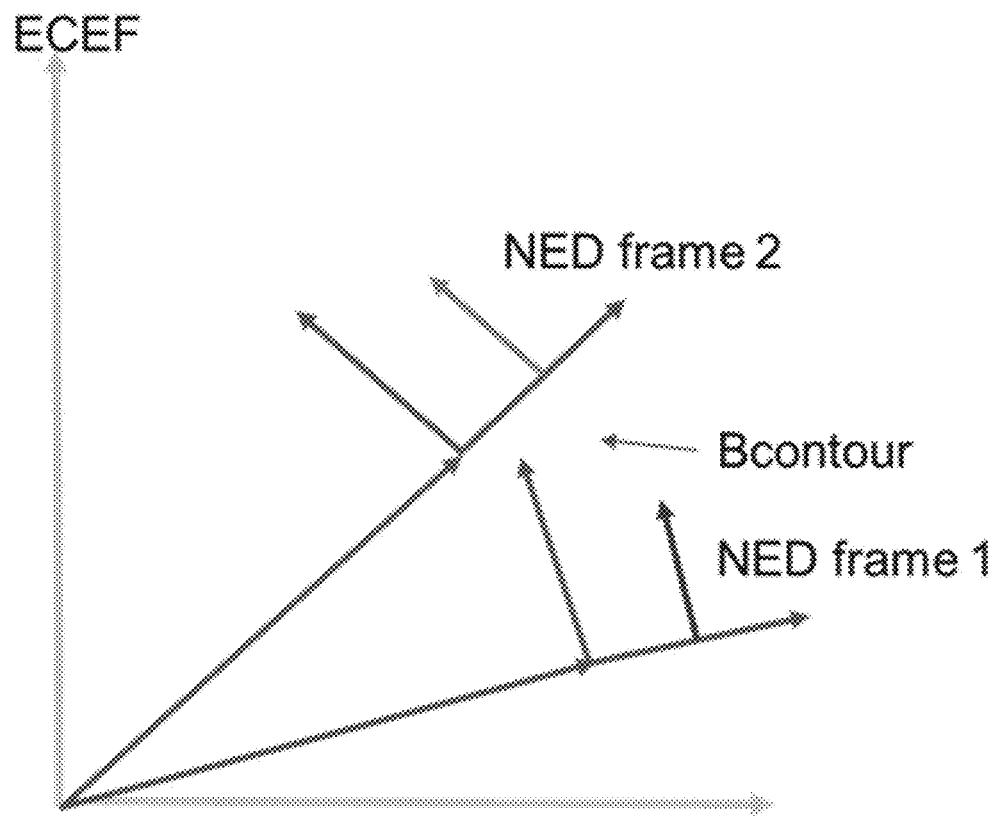
FIGS. 10A-10C are illustrative measured magnetic field measurements relative to known longitudinal and latitudinal positions of a vehicle that are separated into East-North-Down components for an Earth-Centered Fixed reference frame.
Figure 10B:
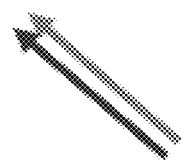
Figure 10C:
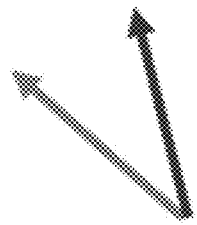

FIGS. 10A-10C illustrate measured magnetic field measurements relative to known longitudinal and latitudinal positions of a vehicle that are separated into East-North-Down components for an Earth-Centered Fixed reference frame.

FIGS. 11A-11B are illustrative measured magnetic field measurements relative to known longitudinal and latitudinal positions of a vehicle separated into x, y, and z components for an Earth-Centered-Inertial reference frame.

Figure 12:
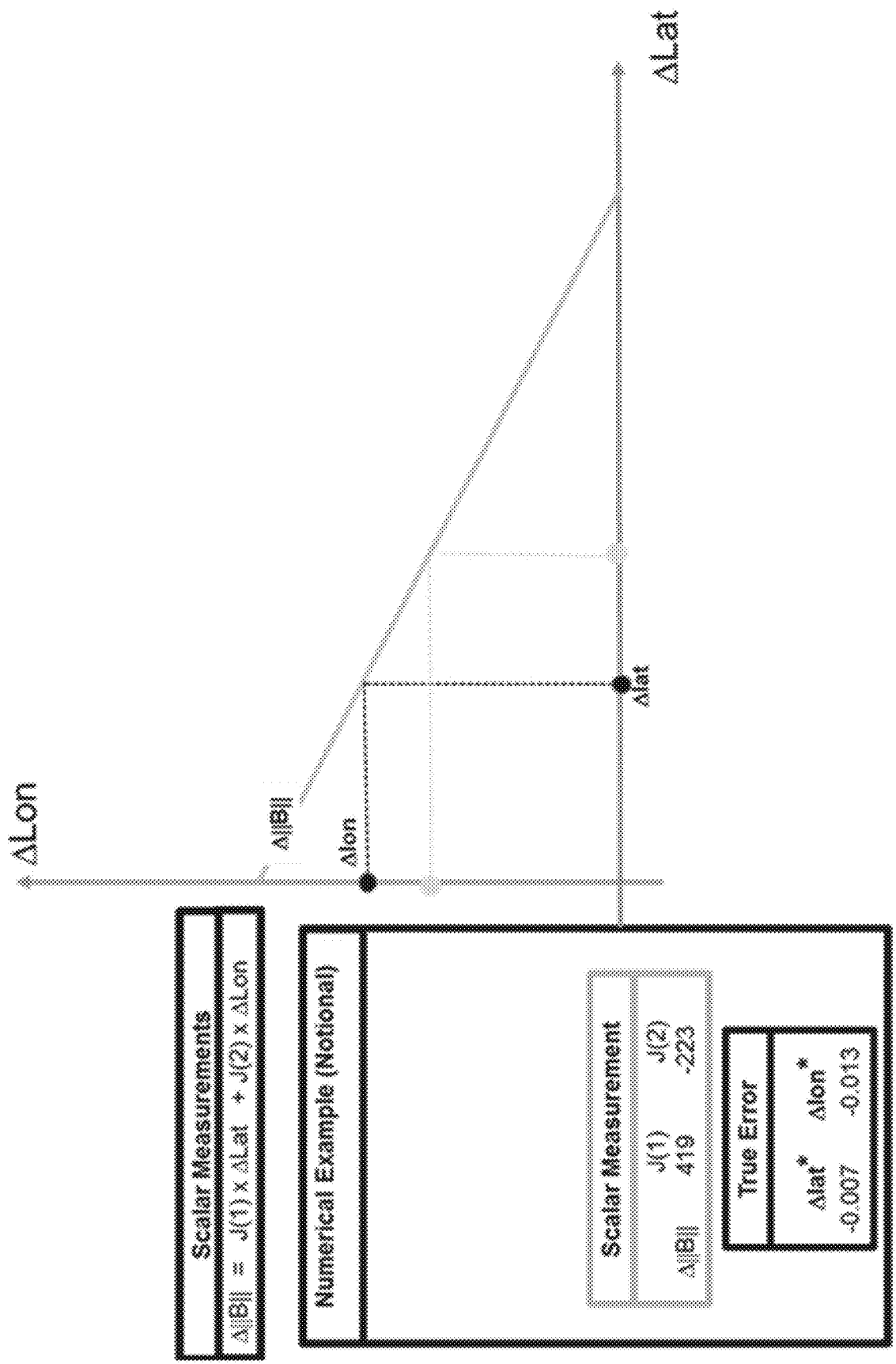
FIG. 12 illustrates an ORSE state error for an East and North component for a scalar system that incrementally increases over time.

FIG. 12 illustrates an ORSE state error for an East and North component for a scalar system that incrementally increases over time.

Figure 13:
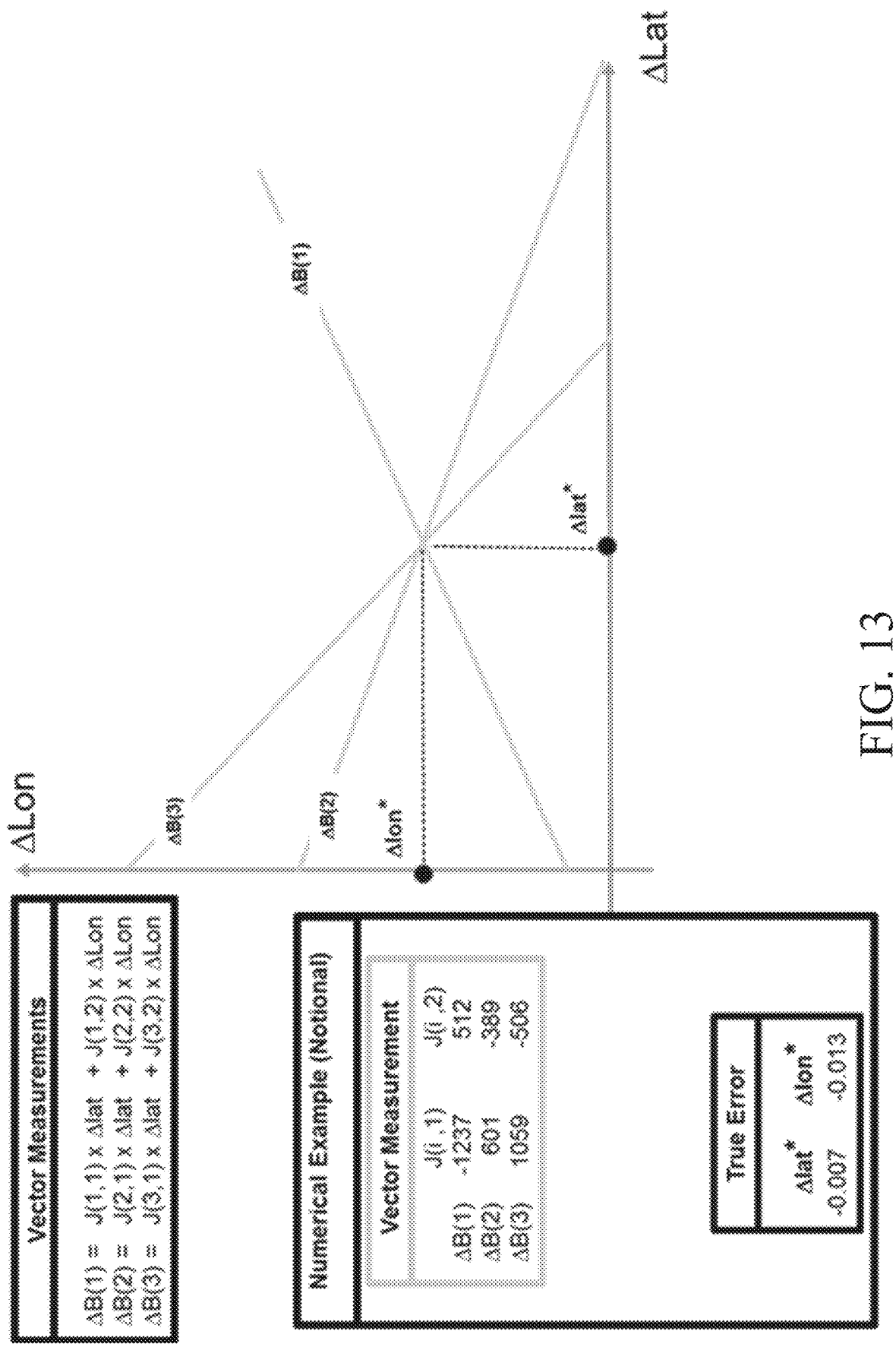
FIG. 13 illustrates an ORSE state error for an East and North component for the Earth-Centered-Inertial reference frame system of FIG. 7.
Figure 14:
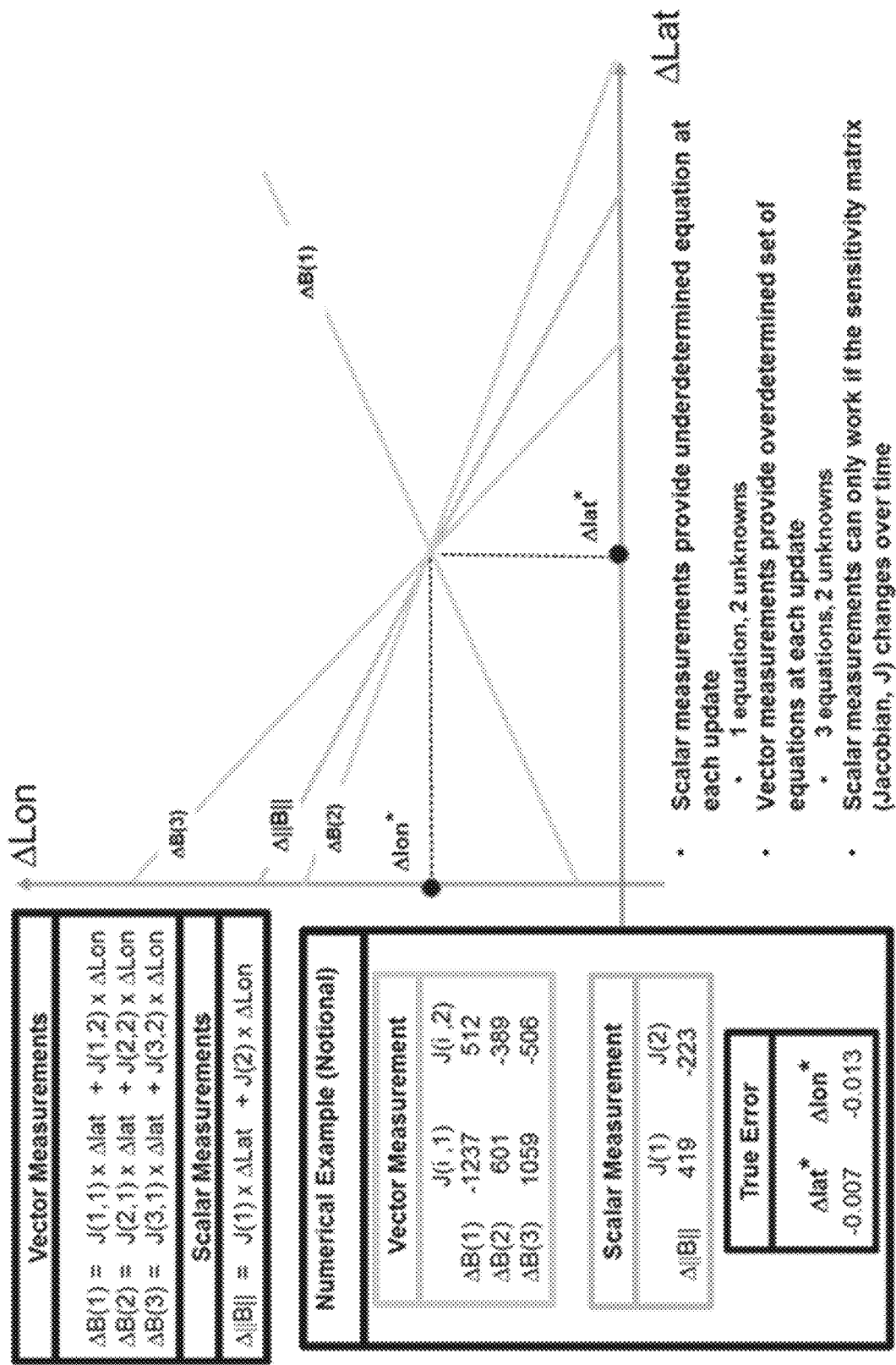
FIG. 14 illustrates an ORSE state error for both East and North component for a scalar system that incrementally increases over time and an East and North component for the Earth-Centered-Inertial reference frame system.
Figure 15:
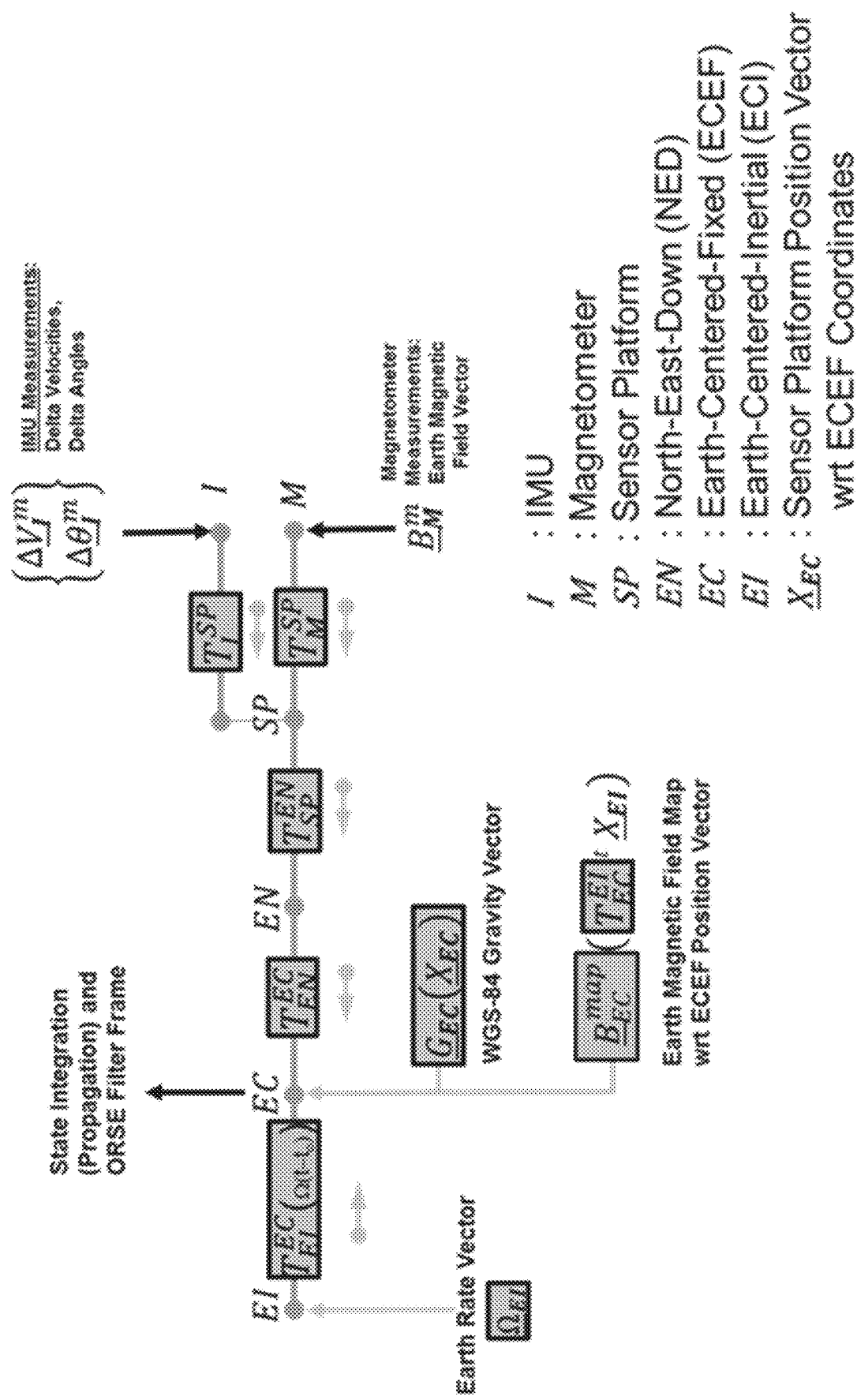
FIG. 15 illustrates the coordinate frame with respect to the navigational system.

FIG. 13 illustrates an ORSE state error for an East and North component for the Earth-Centered-Inertial reference frame system. FIG. 14 depicts an ORSE state error for both East and North component for a scalar system that incrementally increases over time and an East and North component for the Earth-Centered-Inertial reference frame system. FIG. 15 illustrates the coordinate frame with respect to the navigational system (e.g., the inertial navigational system 700).

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology. In some aspects, the subject technology may be used in various markets, including for example and without limitation, advanced sensors and mobile space platforms.

There may be many other ways to implement the subject technology. Various functions and elements described herein may be partitioned differently from those shown without departing from the scope of the subject technology. Various modifications to these embodiments may be readily apparent to those skilled in the art, and generic principles defined herein may be applied to other embodiments. Thus, many changes and modifications may be made to the subject technology, by one having ordinary skill in the art, without departing from the scope of the subject technology.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases. Every combination of components described or exemplified can be used to practice the embodiments, unless otherwise stated. Some embodiments can be modified to incorporate any number of variations, alterations, substitutions or equivalent arrangements not heretofore described, but which are commensurate with the spirit and scope of the embodiments. Additionally, while various embodiments of the disclosure have been described, it is to be understood that aspects of the disclosure may include only some of the described embodiments. Accordingly, the disclosure is not to be seen as limited by the foregoing description.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various embodiments described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. A system comprising:
   an inertial measurement unit;
   a magnetometer configured to measure a magnetic field; and
   a processing system comprising an optimal reduced state estimate (ORSE) filter, and configured to:
      determine an estimated position of a sensor platform based on a change in velocity or angular rate of the sensor platform using data received from the inertial measurement unit,
      determine an expected magnetic field measurement based on the estimated position,
      determine a difference between the measured magnetic field from the magnetometer and the expected magnetic field measurement, and
      determine a state estimate of the sensor platform using the ORSE filter by updating a time propagation of state and covariance with a measurement update of the state and covariance,
   wherein the processing system is configured to transform a change in velocity, a change in angulate rate, and the measured magnetic field from a sensor platform reference frame to an Earth-centered inertial reference frame for the ORSE filter in accordance with at least one transform factor for the sensor platform.

2. The system of claim 1, wherein the magnetometer is a magneto-optical defect center magnetometer.

3. The system of claim 1, wherein the magnetometer is a diamond nitrogen vacancy magnetometer.

4. The system of claim 1, wherein determining an expected magnetic field measurement based on the estimated position comprises accessing one or more parameter values from a reference table based on a longitudinal position and a latitudinal position.

5. The system of claim 4, wherein the reference table is based on an Enhanced Magnetic Model (EMM) map.

6. The system of claim 1, wherein the inertial measurement unit comprises one or more gyros.

7. The system of claim 1, wherein the inertial measurement unit comprises one or more accelerometers.

8. The system of claim 1, wherein the inertial measurement unit comprises three gyros and three accelerometers arranged in a 3-axis orthogonal arrangement.

9. The system of claim 1, wherein the magnetometer includes one or more gyros to provide a reference position for the magnetometer.

10. A process comprising:
    setting an initial state position and angular position for a vehicle;
    receiving a measured change in velocity for the vehicle and a measured change in angular rate for the vehicle based on data from an inertial measurement unit;
    receiving a measured magnetic field from a magnetometer for the vehicle;
    determining an estimated position based on the change in velocity or angular rate;
    determining an expected magnetic field measurement based on the estimated position;
    determining a difference between the measured magnetic field from the magnetometer and the expected magnetic field measurement; and
        determine a state estimate of the vehicle utilizing an optimal reduced state estimate (ORSE) filter to update a time propagation of state and covariance with a measurement update of the state and covariance;
        wherein the measured change in velocity, the measured change in angulate rate, and the measured magnetic field are transformed from a vehicle reference frame to an Earth-centered inertial reference frame for the ORSE filter in accordance with at least one transform factor for the vehicle.

11. The process of claim 10, wherein the measured change in velocity and the measured change in angular rate are based on measurements from one or more gyros or accelerometers of the inertial measurement unit (IMU).

12. The process of claim 10, wherein the inertial measurement unit can include three gyros and three accelerometers arranged in a 3-axis orthogonal arrangement.

13. The process of claim 10, wherein the magnetometer is a magneto-optical defect center magnetometer.

14. The process of claim 10, wherein the magnetometer is a diamond nitrogen vacancy magnetometer.

15. The process of claim 10, wherein determining an expected magnetic field measurement based on the estimated position comprises accessing one or more parameter values from a reference table based on a longitudinal position and a latitudinal position.

16. The process of claim 15, wherein the reference table is based on an Enhanced Magnetic Model (EMM) map.

17. The system of claim 15, wherein the vehicle is a rotary wing aircraft, a fixed wing aircraft, a ship, a spacecraft, a motor vehicle, a robotic vehicle, or a projectile.

18. A vehicle navigation system comprising:
    an inertial measurement unit comprising one or more gyros and one or more accelerometers, the inertial measurement system configured to determine, for a sensor platform, one of an absolute velocity and an absolute angular rate or a change in velocity and a change in angular rate;
    a magneto-optical defect center magnetometer configured to measure a magnetic field; and
    a processing system comprising an optimal reduced state estimate (ORSE) filter and configured to:
       determine an estimated position of the sensor platform based on data received from the inertial measurement unit,
       determine an expected magnetic field measurement for the sensor platform based on the estimated position,
       determine a difference between the measured magnetic field from the magnetometer and the expected magnetic field measurement, and
       determine a state estimate of the sensor platform using the ORSE filter by updating a time propagation of state and covariance with a measurement update of the state and covariance, wherein the processing system is configured to transform the measured magnetic field from a sensor platform reference frame to an Earth-centered inertial reference frame for the ORSE filter in accordance with at least one transform factor for the sensor platform, wherein the ORSE filter measurement noise matrix accounts for alignment bias, wherein an enhanced magnetic model (EMM) map is parameterized with respect to inertial coordinates.

19. The system of claim 18, wherein the processing system is configured to transform the one of the absolute velocity and the absolute angular rate or the change in velocity and the change in angular rate to an Earth-centered inertial reference frame for the ORSE filter.

20. The system of claim 18, wherein determining an expected magnetic field measurement based on the estimated position comprises accessing one or more parameter values from a reference table based on the EMM map using a longitudinal position and a latitudinal position.

21. A vehicle navigation system comprising:
means for determining one of an absolute velocity and an absolute angular rate or a change in velocity and a change in angular rate of a sensor platform;
means for measuring a magnetic field; and a processing system comprising:
  means for determining a difference between the measured magnetic field and the expected magnetic field measurement, and
  means for determining a state estimate of the sensor platform by updating a time propagation of state and covariance with a measurement update of the state and covariance;
wherein the processing system is configured to transform the measured magnetic field from a sensor platform reference frame to an Earth-centered inertial reference frame for the means for determining the state estimate in accordance with at least one transform factor for the sensor platform.

* * * * *